(12) United States Patent
Tanji

(10) Patent No.: US 6,466,101 B2
(45) Date of Patent: *Oct. 15, 2002

(54) MICROSTRIP LINE-WAVEGUIDE CONVERTER STRUCTURE, INTEGRATED CIRCUIT PACKAGE FOR HIGH FREQUENCY SIGNALS PROVIDED WITH THIS CONVERTER STRUCTURE, AND MANUFACTURING METHOD THEREFOR

(75) Inventor: Koki Tanji, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/336,748

(22) Filed: Jun. 21, 1999

(65) Prior Publication Data

US 2001/0043127 A1 Nov. 22, 2001

(30) Foreign Application Priority Data

Jul. 8, 1998 (JP) .......................................... 10-193487

(51) Int. Cl.[7] ............................... H01P 3/08; H01P 5/02
(52) U.S. Cl. ............................................ 333/34; 333/26
(58) Field of Search ............................ 333/26, 34, 246, 333/247; 257/664

(56) References Cited

U.S. PATENT DOCUMENTS 2,825,876 A * 3/1958 Le Vine et al. ........... 333/26 X
2,829,348 A * 4/1958 Kostriza et al. .............. 333/26

(List continued on next page.)

FOREIGN PATENT DOCUMENTS

DE        42 41 635 C2     6/1994
JP         51-28378          8/1976

(List continued on next page.)

OTHER PUBLICATIONS

Japanese Office Action, dated Dec. 11, 2000, with English language translation of Japanese Examiner's comments.
"IEEE Transactions on Microwave Theory and Techniques", Apr. 1967, vol. MTT–15, No. 4, pp. 273–274.

Primary Examiner—Benny Lee
(74) Attorney, Agent, or Firm—Whitham, Curtis & Christofferson, PC

(57) ABSTRACT

There is provided a microstrip line—waveguide conversion structure, an integrated circuit package for high frequency signals provided with this conversion structure, and a manufacturing method therefor, which are capable of reducing the passage loss even when frequencies in the millimeter band are employed, which has a simple structure, and which is capable of application to broadband frequencies. This package is provided with a base member 4 on which an MMIC 2 and the like are installed, a dielectric substrate 5 which is provided on this base member 4, a microstrip line 6 which is provided on the dielectric substrate 5 and which is electrically connected to the integrated circuit for high frequency signals, a frame member 7, in which an opening 7a which encloses the integrated circuit for high frequency signals is formed, and in which a concave portion 7b which engages with the dielectric substrate 5 is formed, and a cover member 8 which seals the opening 7a of frame member 7 and creates an airtight seal. The waveguide portion 5a which is formed by the engaging of concave portion 7b with the widened portions 6d on the dielectric substrate 5 serves as a waveguide employing a dielectric material as the medium thereof, and converts the transmission mode of the high frequency signals transmitted by the microstrip line 6 to the transmission mode of the dielectric waveguide.

46 Claims, 17 Drawing Sheets

U.S. PATENT DOCUMENTS

| | | | | |
|---|---|---|---|---|
| 3,188,583 A | * | 6/1965 | Boyd | 333/26 |
| 3,777,287 A | * | 12/1973 | Louvel | 333/246 |
| 4,891,614 A | * | 1/1990 | De Ronde | 333/34 X |
| 4,901,041 A | * | 2/1990 | Pengelly | 333/246 X |
| 4,953,001 A | * | 8/1990 | Kaiser, Jr. et al. | 333/247 X |
| 5,235,300 A | * | 8/1993 | Chan et al. | 333/26 X |
| 5,936,492 A | * | 8/1999 | Shingyoji et al. | 333/260 X |
| 6,002,305 A | * | 12/1999 | Sanford et al. | 333/26 |

FOREIGN PATENT DOCUMENTS

| | | | | |
|---|---|---|---|---|
| JP | 52-106249 | 9/1977 | | |
| JP | 52-127046 | 10/1977 | | |
| JP | 58-215802 | 12/1983 | | |
| JP | 265704 | * 10/1989 | | 333/26 |
| JP | 37803 | * 2/1990 | | 333/26 |
| JP | 5-343904 | 12/1993 | | |
| JP | 6-168402 | 9/1994 | | |
| JP | 7-307605 | 11/1995 | | |
| JP | 9-260913 | 10/1997 | | |

* cited by examiner

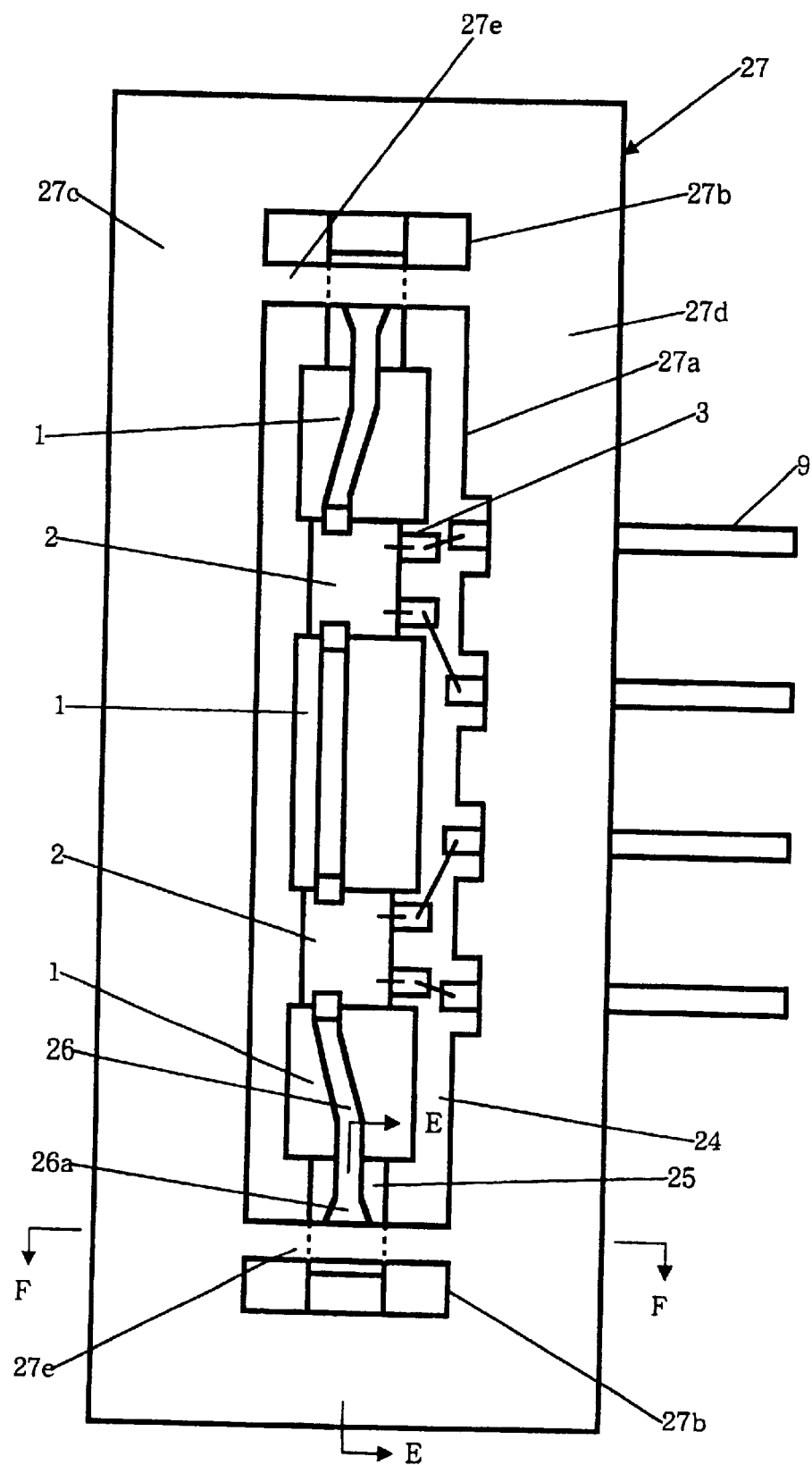

Fig. 15A *(PRIOR ART)*
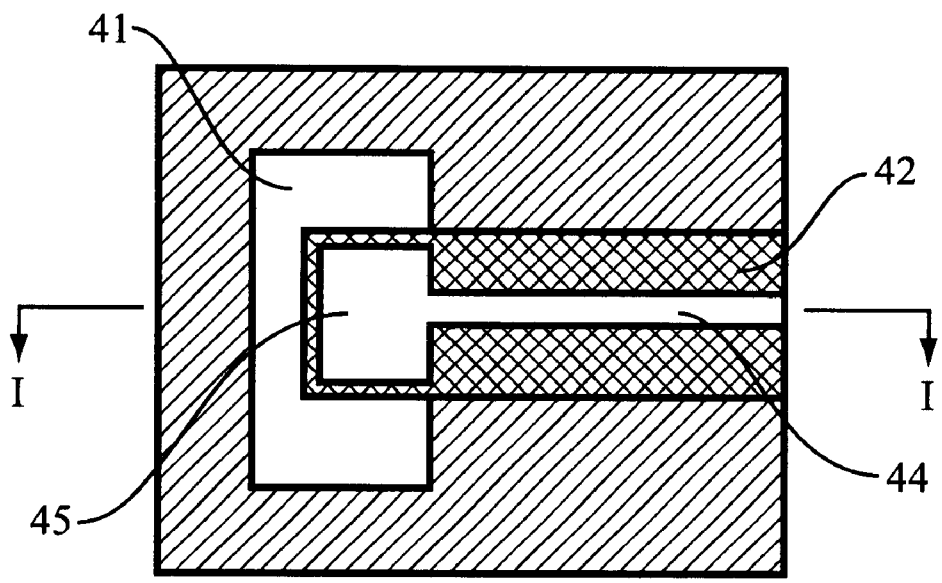
Fig. 15B *(PRIOR ART)*
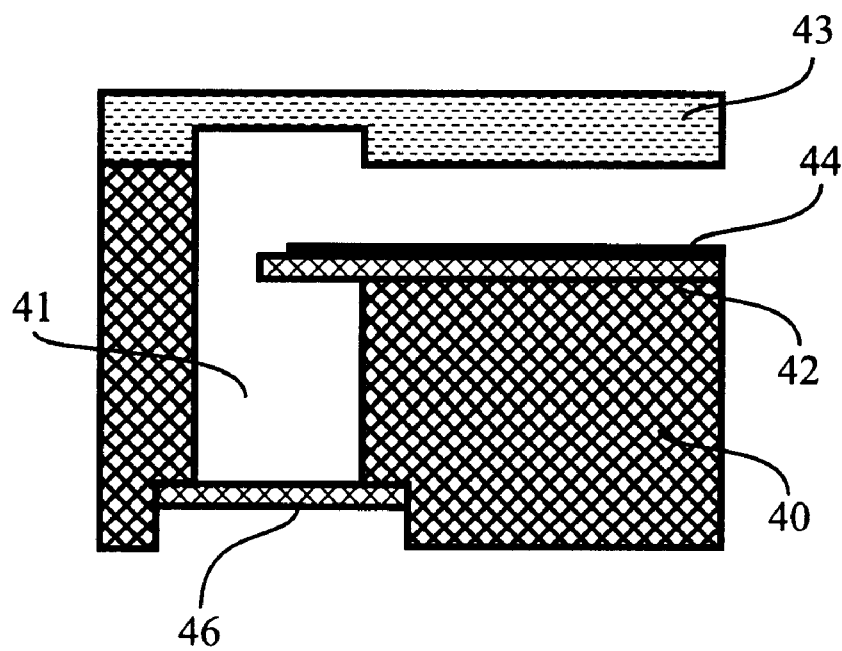

Fig. 16 *(PRIOR ART)*
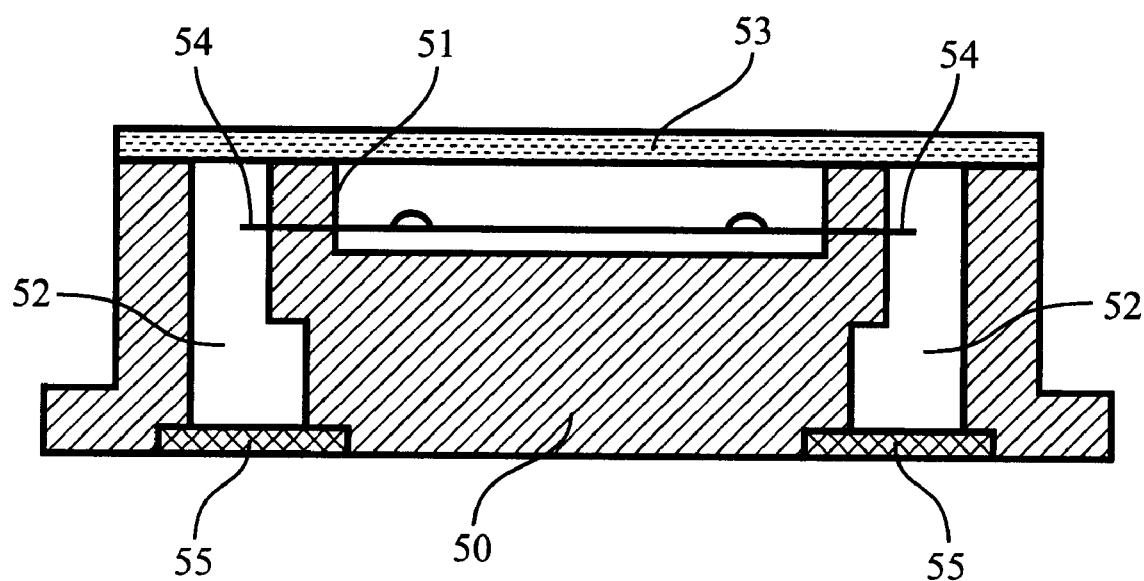

MICROSTRIP LINE-WAVEGUIDE CONVERTER STRUCTURE, INTEGRATED CIRCUIT PACKAGE FOR HIGH FREQUENCY SIGNALS PROVIDED WITH THIS CONVERTER STRUCTURE, AND MANUFACTURING METHOD THEREFOR

BACKGROUND OF THE INVENTION

1. Field of the Invention

The present invention relates to a microstrip line-waveguide conversion structure, to an integrated circuit package for high frequency signals employing this conversion structure, and to a manufacturing method therefor, and in particular, relates to a microstrip line-waveguide conversion structure, an integrated circuit package for high frequency signals provided with this conversion structure and a manufacturing method therefor, which are adopted for the airtight sealing of integrated circuits employed in the millimeter band.

2. Background Art

In general, in semiconductor integrated circuit modules employing the millimeter or micrometer wavebands, it is necessary to provide a structure having an airtight seal in order to increase reliability. However, in the millimeter waveband, the physical dimensions of the interface in coaxial bonds employing the glass sealing which was employed in the micrometer waveband become small, and the requirements for manufacturing precision become severe, so that this has not been conducted.

Techniques in which semiconductor integrated circuits are sealed in an airtight manner using waveguides have been proposed. For example, in "60 GHz Band Signal Receiving Module", which is found on page 136 of the first volume of the Collected Papers of the Electronics Society Conference of the Electronic Information Communication Study Group of 1995, a structure is disclosed which directly converts high frequency signals from a microstrip line to a waveguide and outputs these to the exterior. FIG. 15A is a plan cross-sectional view showing the structure of the high frequency interface portion of a conventional integrated circuit package (hereinbelow referred to as Conventional Example 1), while FIG. 15B is a cross-sectional view taken along the line I—I in FIG. 15A.

As shown in FIGS. 15A and B, the integrated circuit package of Conventional Example 1 is provided with a package base portion 40 which is made from metal or the like, a waveguide 41 which extends approximately vertically within the package base portion 40, a dielectric substrate 42, which is provided on package base portion 40 and which is disposed so that the end portion thereof is positioned within waveguide 41, and a cover portion 43, which is made from metal or the like and which closes the upper portion of package base portion 42. A microstrip line 44 which serves to transmit the high frequency signal is provided on top of the dielectric substrate 42.

A microstrip line-waveguide converter 45, which is connected with the microstrip line 44, and which serves to conduct conversion between the transmission mode of the microstrip line 44 and the transmission mode of the waveguide, is provided on top of the end portion of dielectric substrate 42.

A sealing dielectric substrate 46 is applied to the lower portion of waveguide 41, and by means of this, airtight sealing of the package is realized.

Furthermore, FIG. 16 is a cross-sectional view showing the package for MIC which is disclosed in Japanese Patent Application, First Publication No. Sho 58-215802 (hereinbelow referred to as Conventional Example 2).

As shown in FIG. 16, the conventional MIC package is provided with package main body 50 comprising a metal such as copper or the like, a concave portion 51 which is formed in the central portion of this package main body 50 and which provides a carrier, waveguides 52 which are formed at both end portions of the main body 50 and which communicate with concave portion 51, a cover 53, which is attached by welding or the like to the upper portion of the package main body 50, a microstrip line 54 for the terminal for high frequency input and output, an end of which projects within the waveguides 52, and an airtight sealing plate 55 comprising an insulator material such as silica glass or the like, which is attached to the bottom portion of waveguides 52.

Furthermore, when a portion or the entirety of waveguides 52 is filled with a dielectric material and sealed in an airtight manner, it is possible to make the waveguides 52 small, so that it is possible to achieve a reduction in size of the package.

The following problems were present in the conventional technology described above.

(1) In the integrated circuit package of Conventional Example 1, interface mismatching is produced at the portion of dielectric substrate 46 which is affixed to waveguide 41, and the reflection coefficient becomes high, so that there is a large passage loss. FIG. 17 is a graph showing a simulation of the passage loss when a conventional integrated circuit is employed. It can be seen from FIG. 17 that the passage loss increases as the frequency increases in conventional integrated circuit packages. Accordingly, it is difficult to employ the integrated circuit package of Conventional Example 1 at millimeter band frequencies of 60 GHz or more.

In the MIC package of Conventional Example 2, as well, as in the package of Conventional Example 1, the interface characteristics are poor at airtight sealing plate 55, and the passage loss increases. In order to prevent passage loss, attempts have been made to construct the airtight sealing plate 55 from a thin material having a low dielectric constant; however, the airtight sealing plate 55 is easily broken, so that there is a problem with the durability thereof.

(2) Dielectric substrate 46 or airtight sealing plate 55 are attached to the bottom portions of waveguides 41 and 52 in order to create an airtight seal, so that the effects caused by the adhesive employed for the affixing or the accuracy of attachment can be striking, and it is difficult to achieve optimal characteristics.

(3) The conversion of the transmission mode is conducted by the microstrip lines 44 and 54 which project in the form of antennae into waveguides 41 and 52, so that it is not possible to employ broadband frequencies. For this reason, the uses are restricted.

SUMMARY OF THE INVENTION

The present invention is carried out to solve the problems described above; and it is as an object thereof to provide a microstrip line-waveguide conversion structure, and an integrated circuit package for high frequency signals employing such a conversion structure, and a manufacturing method therefor, which are capable of reducing the passage loss even when millimeter band frequencies are employed, in which the structure is simple, and which may be applied to broadband frequencies.

The microstrip line-waveguide conversion structure of the present invention has a dielectric substrate, and a microstrip line which is provided on the dielectric substrate and is provided with widened portions which are formed so as to broaden a conductor, wherein is provided a waveguide portion containing the widened portions on the dielectric substrate.

It is preferable that transmission mode converters formed so as to incline in the direction of the widened portions be provided in the vicinity of the widened portions of the microstrip line.

The high frequency signal transmitted is a signal in, for example, the millimeter waveband.

In the first integrated circuit package for high frequency signals of the present invention, an integrated circuit for high frequency signals which is provided on a base member, and a microstrip line which is provided with widened portions formed so as to widen a conductor, are covered from the upper portion thereof in an attached manner by a metal cover, and, at the point of contact between the metal cover and the widened portions provided in the microstrip line, a waveguide portion formed on a dielectric substrate is provided, and an airtight seal is formed.

It is preferable that transmission mode converters formed so as to incline in the direction of the widened portions be provided in the vicinity of the widened portions of the microstrip line.

The shape of the waveguide portion is determined by the width and thickness of the dielectric substrate.

The second integrated circuit package for high frequency signals of the present invention is provided with: a base member on which an integrated circuit for high frequency signals is installed, a dielectric substrate which is provided on the base member, a microstrip line which is provided on the dielectric dielectric substrate, is electrically connected with the integrated circuit for high frequency signals, and which is provided with widened portions formed so as to widen a conductor so as to be approximately equivalent to the width of the dielectric substrate, a frame member in which a concave portion, which engages with the widened portions of the microstrip line and the dielectric substrate, is formed, and in which an opening which encloses the periphery of the integrated circuit for high frequency signals is formed, and a cover member, which seals the opening of the frame member, and seals in an airtight manner the integrated circuit for high frequency signals; wherein a waveguide portion, which is formed on the dielectric substrate at a point of contact between the widened portions provided in the microstrip line and the concave portion of the frame member, is provided, and an airtight seal is achieved.

The third integrated circuit package for high frequency signals of the present invention is provided with: a base member on which an integrated circuit for high frequency signals is installed, a dielectric substrate which is provided on the base member and which engages with a concave portion, a microstrip line which is provided on the dielectric substrate, is electrically connected with the integrated circuit for high frequency signals, and which is provided with widened portions formed so as to widen a conductor so as to be approximately equivalent to the width of the dielectric substrate, a frame member which is positioned on the widened portions of the microstrip line, and in which an opening which encloses the periphery of the integrated circuit for high frequency signals is formed, and a cover member, which seals the opening of the frame member, and seals in an airtight manner the integrated circuit for high frequency signals; wherein a waveguide portion, which is formed on the dielectric substrate at a point of contact between the widened portions provided in the microstrip line and the frame member, is provided, and an airtight seal is achieved.

The microstrip line may be formed so as to extend to the outside of the frame member, and portions of the microstrip line extending outside the frame member may serve as input and output interface portions for high frequency signals.

The frame member may be provided with a first frame portion and a second frame portion which are disposed with a predetermined space therebetween, and a pair of third frame portions provided at both end portions of the first frame portion and the second frame portion, and the opening may be formed within the first frame portion, the second frame portion, and the third frame portions.

The fourth integrated circuit package for high frequency signals of the present invention is provided with: a base member on which an integrated circuit for high frequency signals is installed, a dielectric substrate which is provided on the base member, a microstrip line which is provided on the dielectric substrate, is electrically connected with the integrated circuit for high frequency signals, and which is provided with widened portions formed so as to widen a conductor so as to be approximately equivalent to the width of the dielectric substrate, a frame member in which a concave portion, which engages with the widened portions of the microstrip line and the dielectric substrate, is formed, in which an opening which encloses the periphery of the integrated circuit for high frequency signals is formed, and in end portions of which notched portions are formed, and a cover member, which seals the opening and the notched portions of the frame member, and seals in an airtight manner the integrated circuit for high frequency signals; wherein a waveguide portion, which is formed on the dielectric substrate at a point of contact between the widened portions provided in the microstrip line and the concave portion of the frame member, is provided, and an airtight seal is achieved, and a spacing portion formed by the notched portions of the frame member, the base member, and the cover member serves as the input and output interface portion for high frequency signals converted to the transmission mode of a waveguide employing air as a medium.

It is preferable that the frame member be provided with a first frame portion and a second frame portion which are disposed with a predetermined space therebetween, and third frame portions which are provided at a position within end portions of the first frame portion and second frame portion and which come into contact with the widened portions of the microstrip line, and that a concave portion, which engages with the widened portions of the microstrip line and the dielectric substrate, be formed in the third frame portions, and the third frame portions be provided with an inclined surface which is outwardly inclined to the side of the cover member, from the contact surface at which contact is made with the upper portion of the widened portions of the microstrip line.

The fifth integrated circuit package for high frequency signals of the present invention is provided with: a base member on which an integrated circuit for high frequency signals is installed, a dielectric substrate which is provided on the base member, a microstrip line which is provided on the dielectric substrate, is electrically connected with the integrated circuit for high frequency signals, and which is provided with widened portions formed so as to widen a conductor so as to be approximately equivalent to the width of the dielectric substrate, a frame member, in which a first opening, which encloses the periphery of the integrated circuit for high frequency signals, and a second opening, which is formed outside the first opening and with a predetermined space therebetween, are formed, and in which a concave portion, which engages with the widened portions of the microstrip line and the dielectric substrate, is formed between the first and second openings, and a cover member, which seals the first and second openings of the frame member, and which seals in an airtight manner the integrated circuit for high frequency signals; wherein a third opening, which communicates with the dielectric substrate at the side of the second opening, is formed in the base member, a waveguide portion, formed on the dielectric substrate at a point of contact between the widened portions provided in the microstrip line and the concave portion of the frame member, is provided, and an airtight seal is formed, and the third opening serves as the input and output interface portion for high frequency signals converted to the transmission mode of the waveguide employing air as the medium thereof.

It is preferable that the third opening of the base member be formed so as to extend approximately vertically downward and be formed so as to widen in the downward direction.

It is preferable that the dielectric substrate be formed from a material having the characteristics of being non-moisture absorbent and having low dielectric loss, such as, for example, alumina.

It is preferable that the frame member and the cover member be formed from a metal such as, for example, Kovar, copper tungsten, or copper.

It is preferable that the base member be formed from a metal such as, for example, Kovar, copper tungsten, or copper.

It is preferable that the base member be formed from, for example, a ceramic multilayered substrate, and that electrical wires connected electrically with the integrated circuit for high frequency signals be disposed between layers of the multilayered substrate.

It is preferable that a transmission mode converter formed so as to be inclined in the direction of the widened portion on the side of the frame member be provided in the microstrip line.

The base member and the frame member may be formed integrally.

The high frequency signals transmitted may be, for example, millimeter waveband signals.

In the manufacturing method for integrated circuit packages for high frequency signals of the present invention, an integrated circuit for high frequency signals, and a microstrip line provided with widened portions formed so as to widen a conductor, are provided on a base member, and next, the integrated circuit for high frequency signals and the widened portions of the microstrip line are attached from above using a metal cover, and a waveguide portion, which is formed on a dielectric substrate at a point of contact between the widened portions provided in the microstrip line and the metal cover, is provided, and an airtight seal is achieved.

Furthermore, in the manufacturing method for integrated circuit packages for high frequency signals, the following are provided:

(1) a process for preparing a base member having an integrated circuit for high frequency signals, a dielectric substrate, and a microstrip line, which is provided on the dielectric substrate, is electrically connected with the integrated circuit for high frequency signals, and wherein is provided widened portions formed so as to widen a conductor so that the width thereof is approximately equal to that of the dielectric substrate, (2) a process for disposing a frame member provided with frame portions in which openings are formed and in which a concave portion is formed so that the concave portion of the frame portions engages with the widened portions of the microstrip line and the dielectric substrate, and the openings enclose the periphery of the integrated circuit for high frequency signals, and for attaching the frame member to the base member, and (3) a process for attaching a cover member to the upper portion of the frame member, closing the opening in the frame member, and sealing the integrated circuit for high frequency signals in an airtight manner; wherein a waveguide portion, formed on the dielectric substrate at a point of contact between the widened portions provided in the microstrip line and the concave portion of the frame member, is provided, and an airtight seal is achieved.

The frame member is attached to the base member by soldering or by welding, and the cover member is attached to the frame member by soldering or by welding.

The high frequency signals transmitted are, for example, signals in the millimeter waveband.

In accordance with the microstrip line-waveguide conversion structure of the present invention, by means of providing a waveguide portion containing a widened portion on a dielectric substrate, it is possible to convert the transmission mode of high frequency signals to the transmission mode of a dielectric waveguide.

In accordance with the integrated circuit package for high frequency signals of the present invention, by means of the waveguide portion formed by the metal cap attached on top of the base portion, it is possible to simultaneously realize the conversion of high frequency signals to the transmission mode of the dielectric waveguide and the airtight sealing of the integrated circuit for high frequency signals.

In accordance with the manufacturing method for integrated circuit packages for high frequency signals of the present invention, it is possible to obtain an integrated circuit package for high frequency signals which is provided with the microstrip line-waveguide conversion structure described above by means of an extremely simple process.

BRIEF DESCRIPTION OF THE DIAGRAMS

Figure 4A:
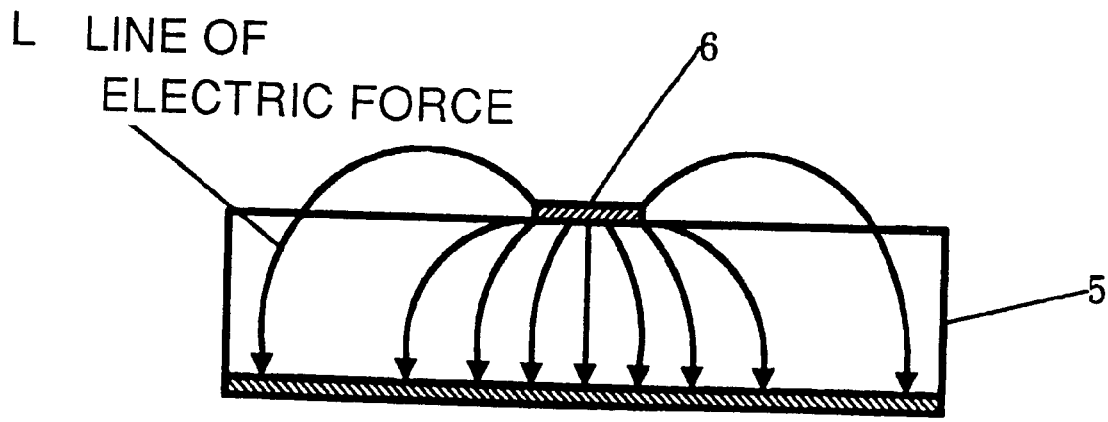
Figure 4B:
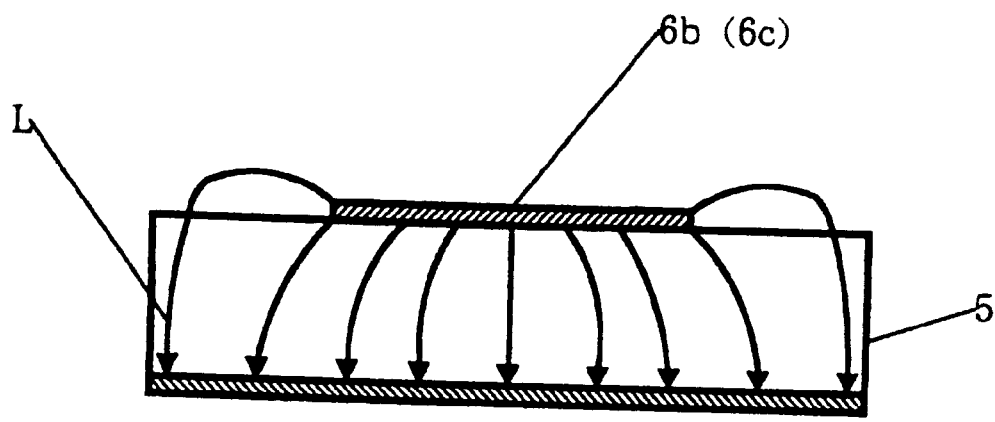
Figure 4C:
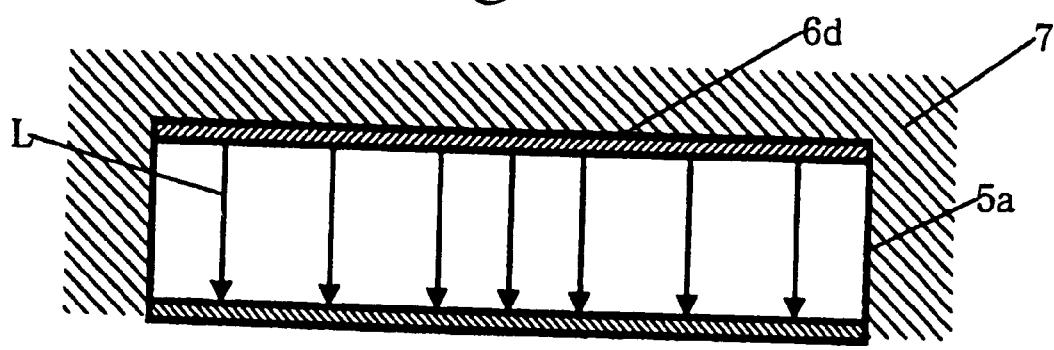

FIGS. 4A, 4B, and 4C contain cross-sectional views showing the electric force line distribution at various points; FIG. 4A shows the microstrip line, FIG. 4B indicates the transmission mode converter, and FIG. 4C indicates the dielectric waveguide.

Figure 5A:
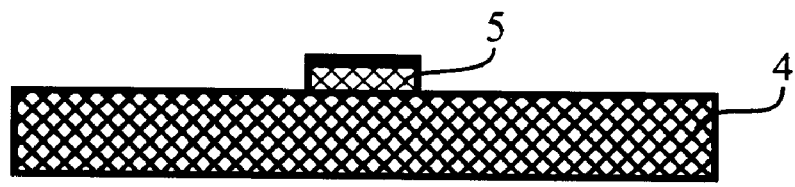
Figure 5B:
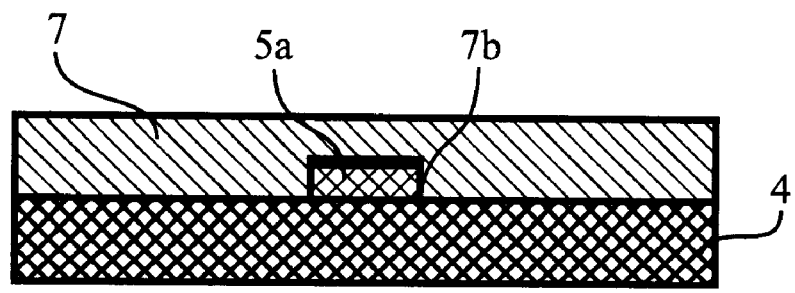
Figure 5C:
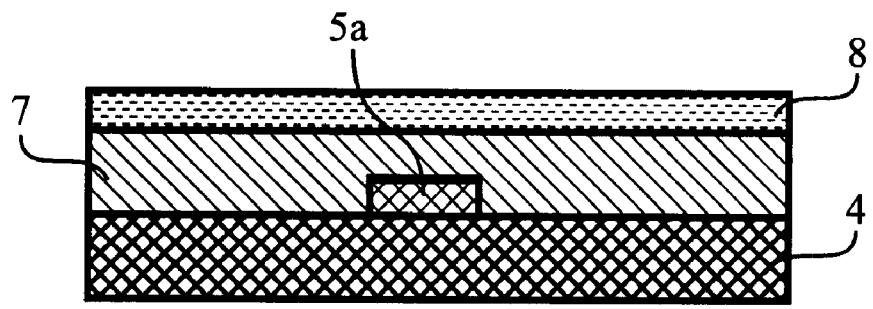

FIGS. 5A, 5B, and 5C contain cross-sectional views showing the order of operations of the manufacturing method of the present invention. FIG. 5C is a cross-sectional view taken along the line A—A in FIG. 3.

Figure 6:
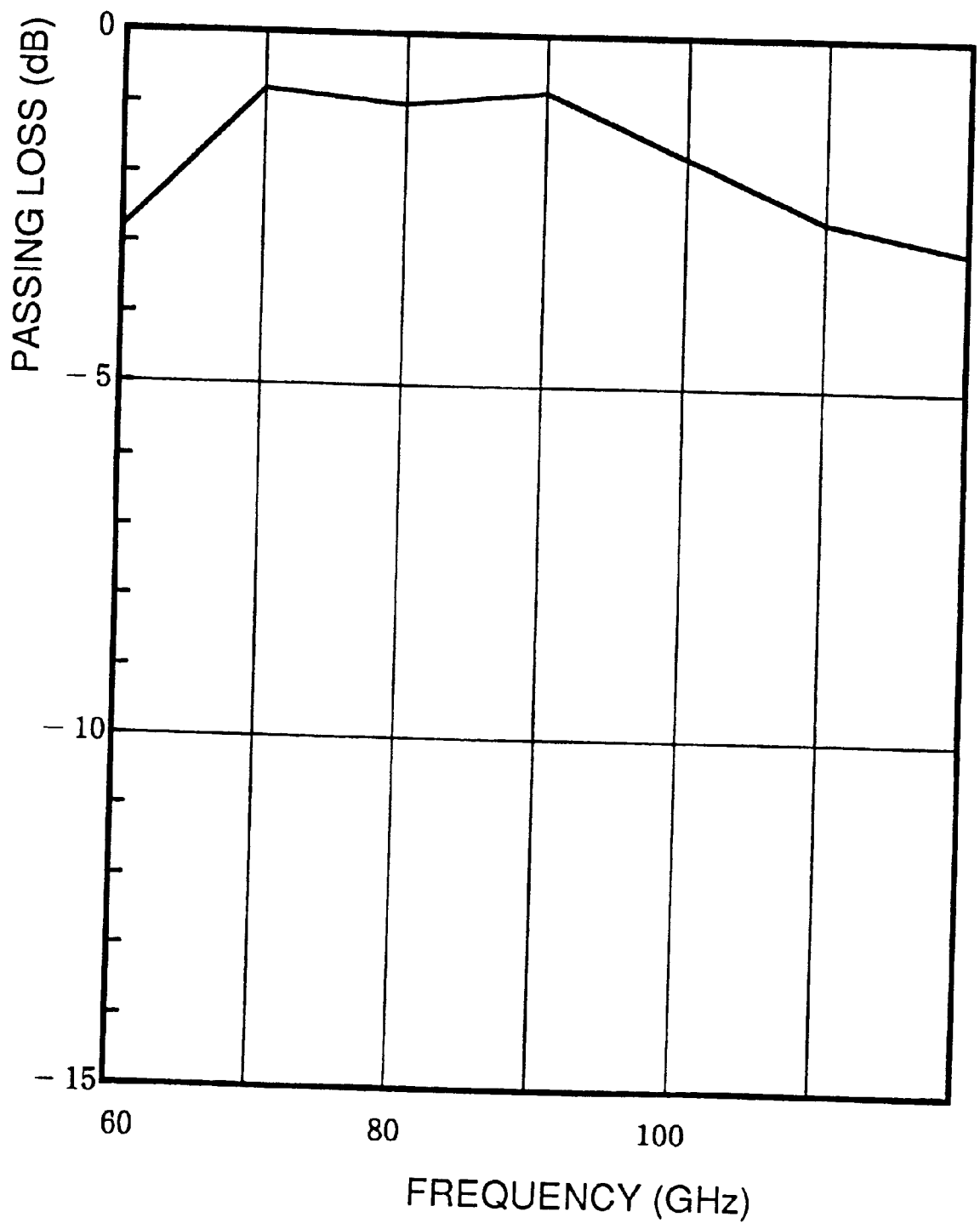

FIG. 6 is a graph showing a simulation of the passage loss when the integrated circuit package for high frequency signals in accordance with the present invention is employed.

Figure 7A:
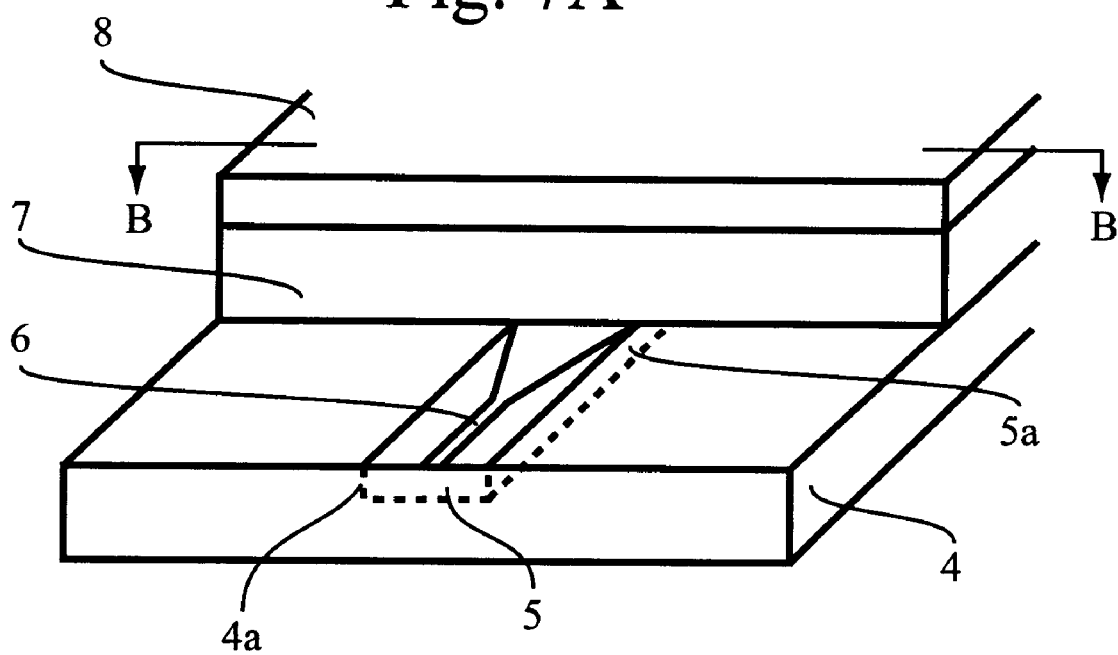
Figure 7B:
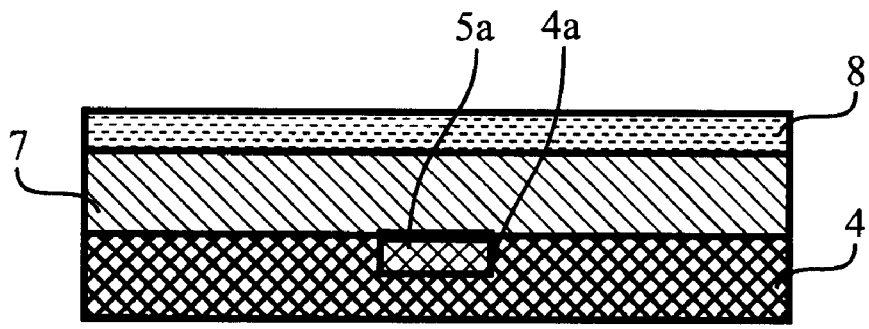

FIG. 7A is a perspective view showing a portion of a integrated circuit package for high frequency signals in accordance with a second embodiment of the present invention, and FIG. 7B is a cross-sectional view along the line B—B in FIG. 7A.

Figure 8:
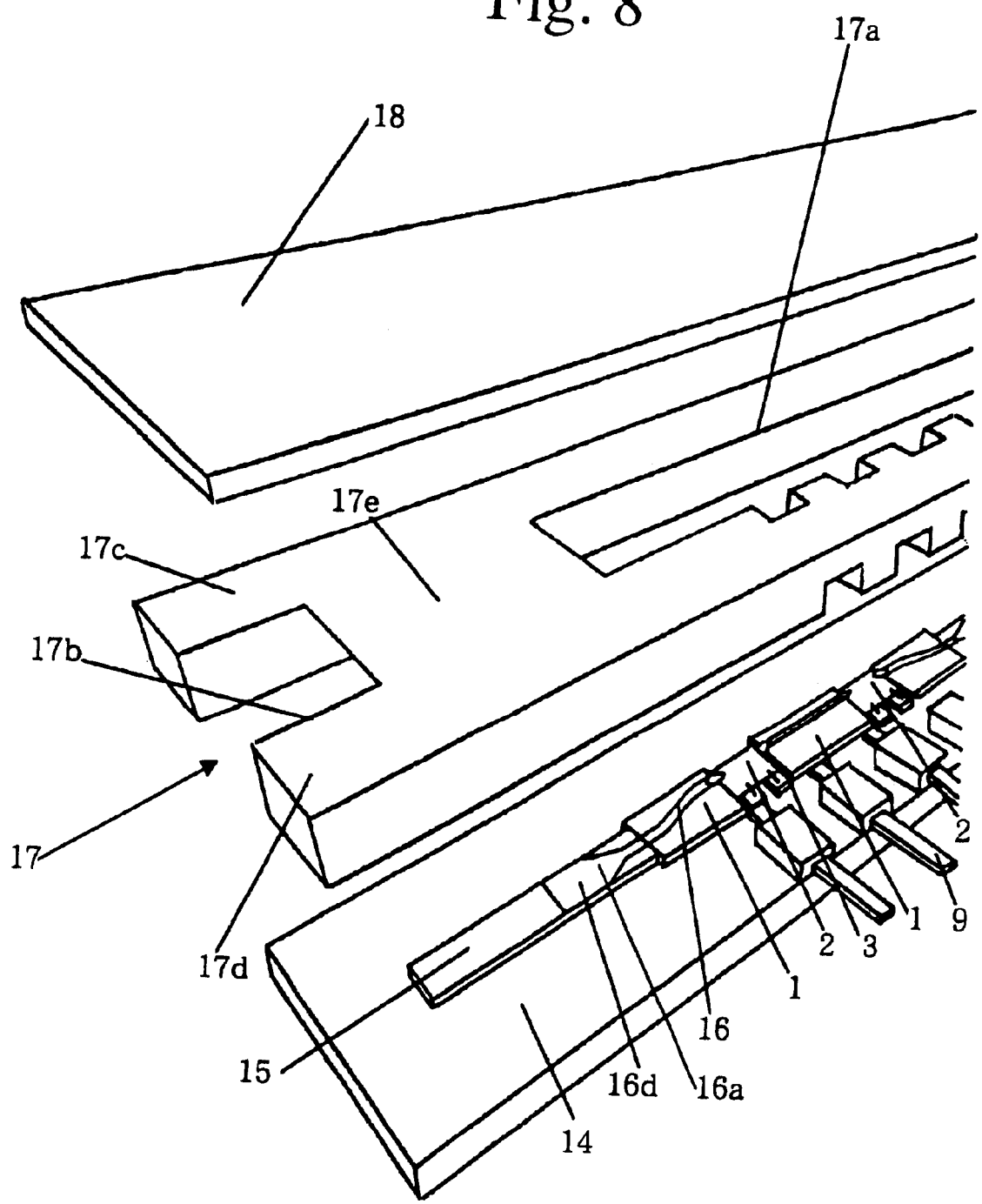

FIG. 8 is an exploded perspective view showing an integrated circuit package for high frequency signals in accordance with a third embodiment of the present invention.

Figure 9:
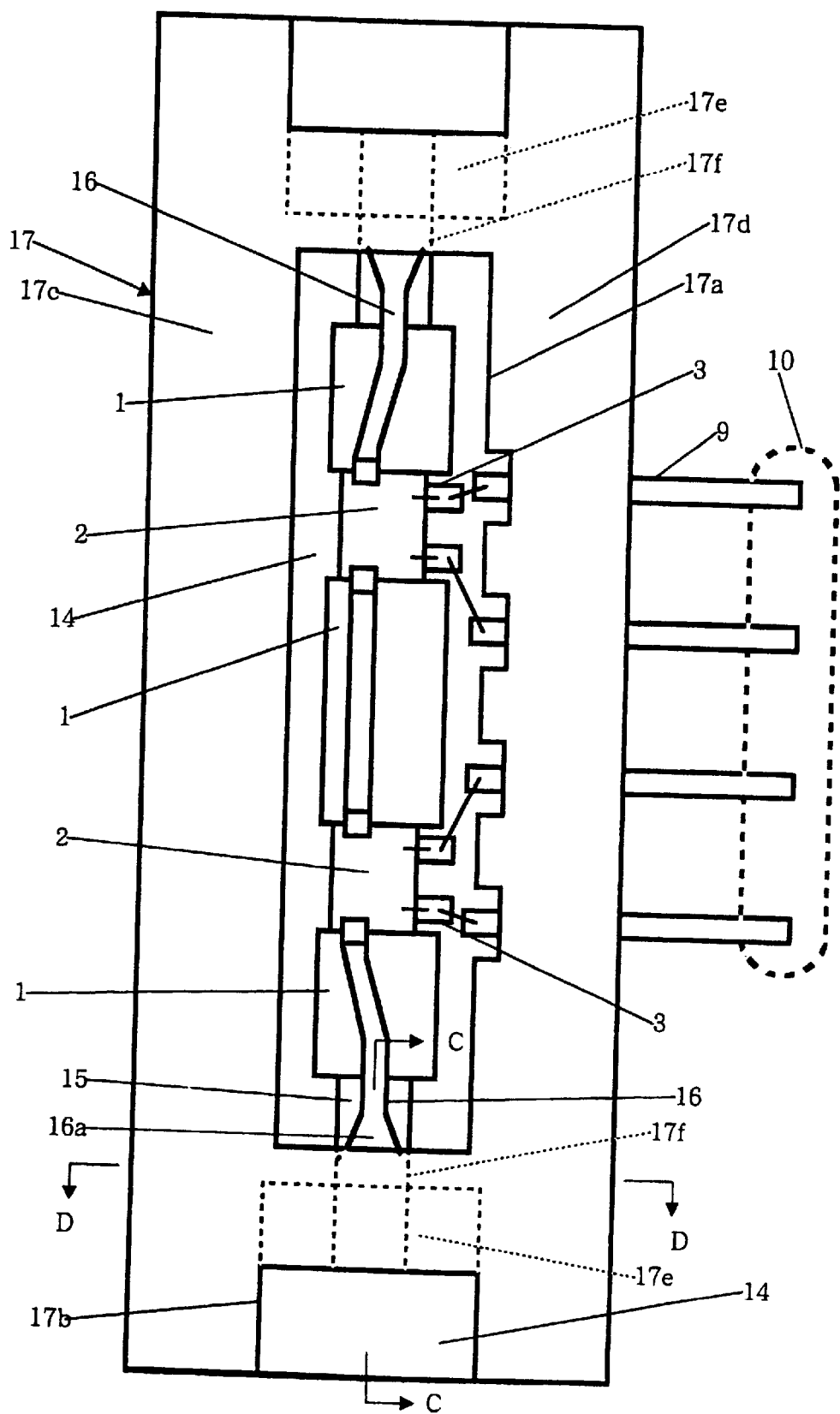

FIG. 9 is a plan view showing the integrated circuit package for high frequency signals in accordance with the third embodiment of the present invention (in a state in which the cover member is removed).

Figure 10A:
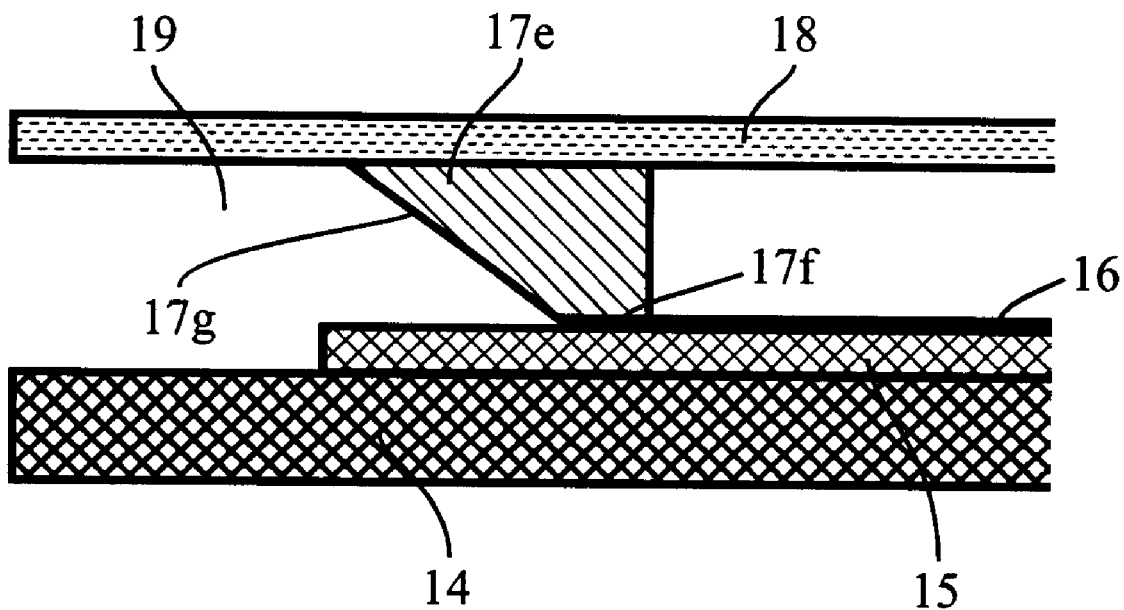
Figure 10B:
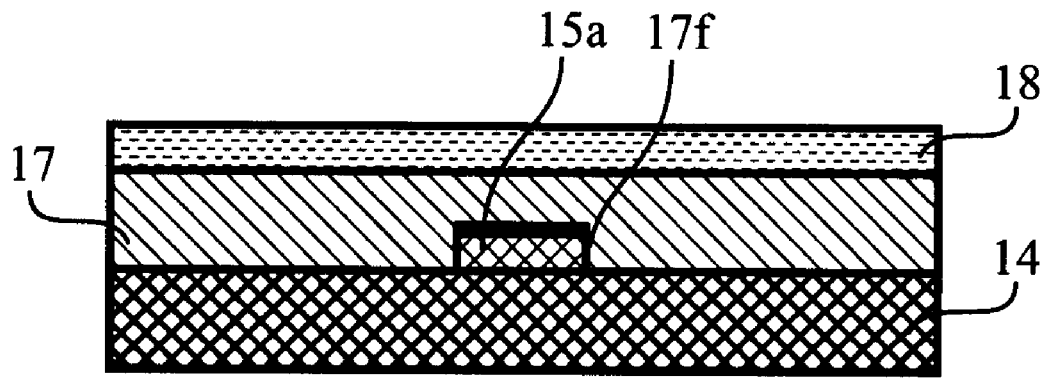

FIG. 10A is a cross-sectional view taken along the line C—C in FIG. 9, while FIG. 10B is a cross-sectional view taken along the line D—D in FIG. 9.

FIG. 11 is a plan view showing an integrated circuit package for high frequency signals in accordance with a fourth embodiment of the present invention (in the state in which the cover member is removed).

Figure 12A:
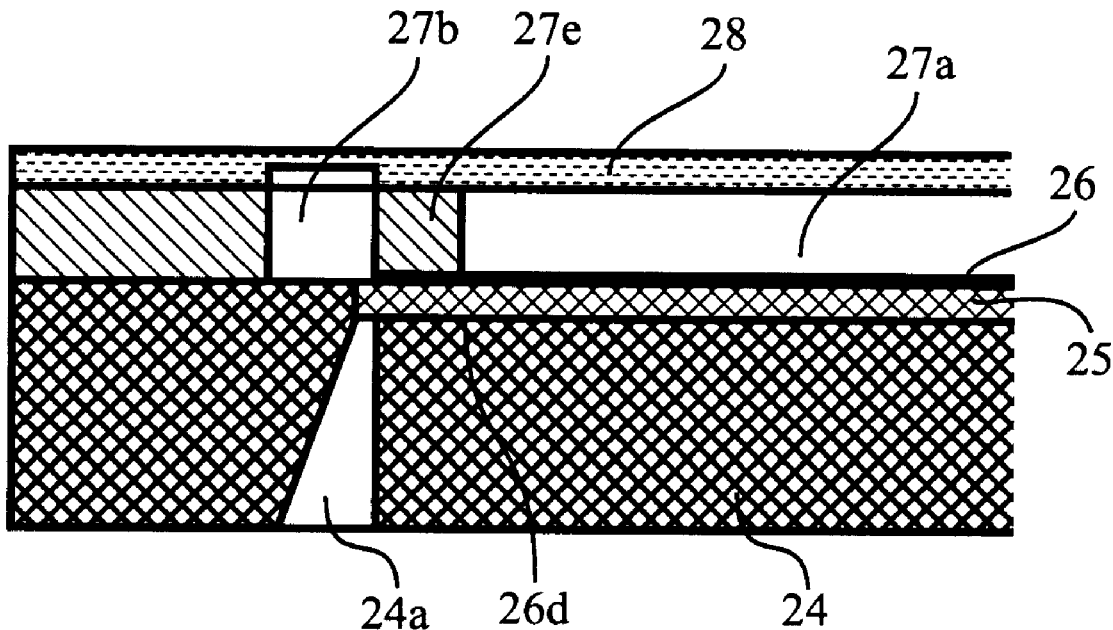
Figure 12B:
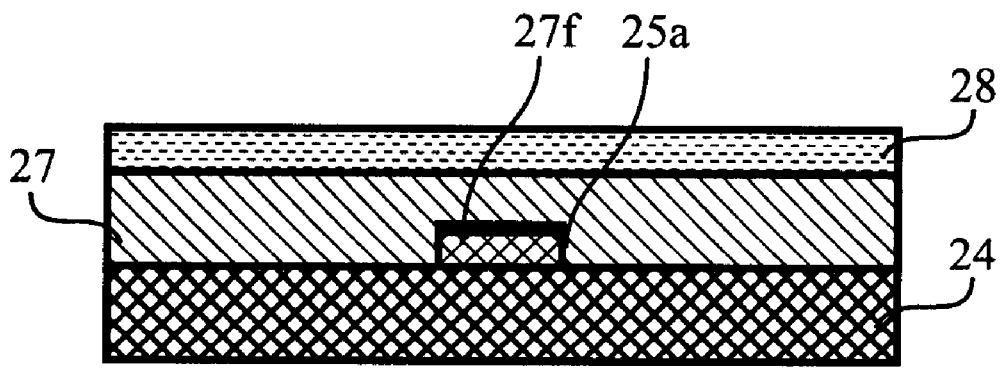

FIG. 12A is a cross-sectional view taken along the line E—E in FIG. 11, while FIG. 12B is a cross-sectional view taken along the line F—F in FIG. 11.

Figure 13:
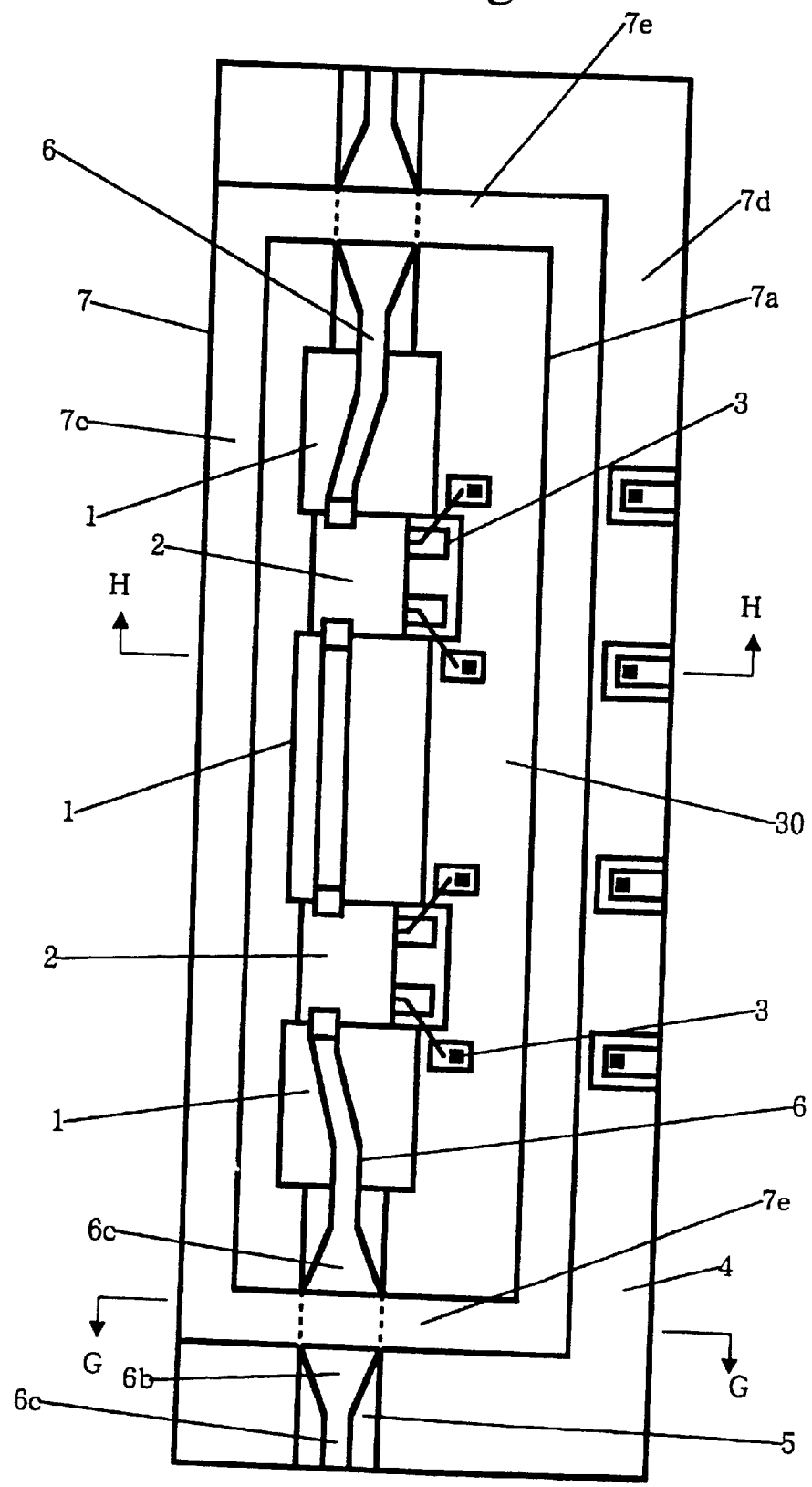

FIG. 13 is a plan view showing an integrated circuit package for high frequency signals in accordance with a fifth embodiment of the present invention (in the state in which the cover member is removed).

Figure 14A:
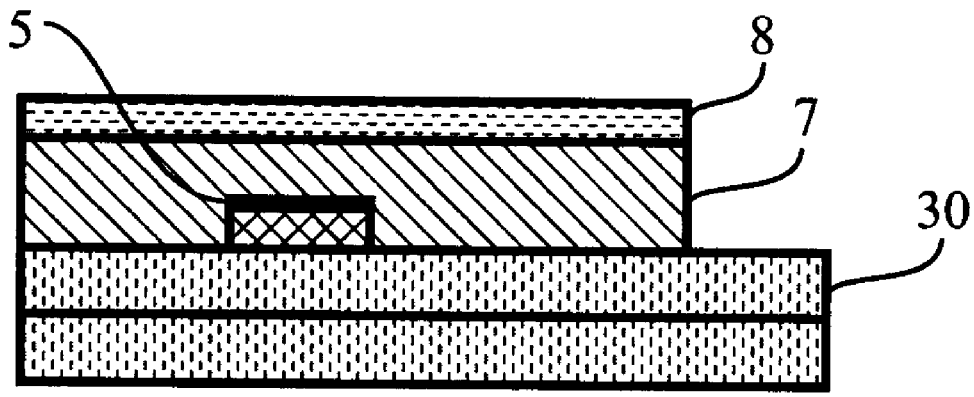
Figure 14B:
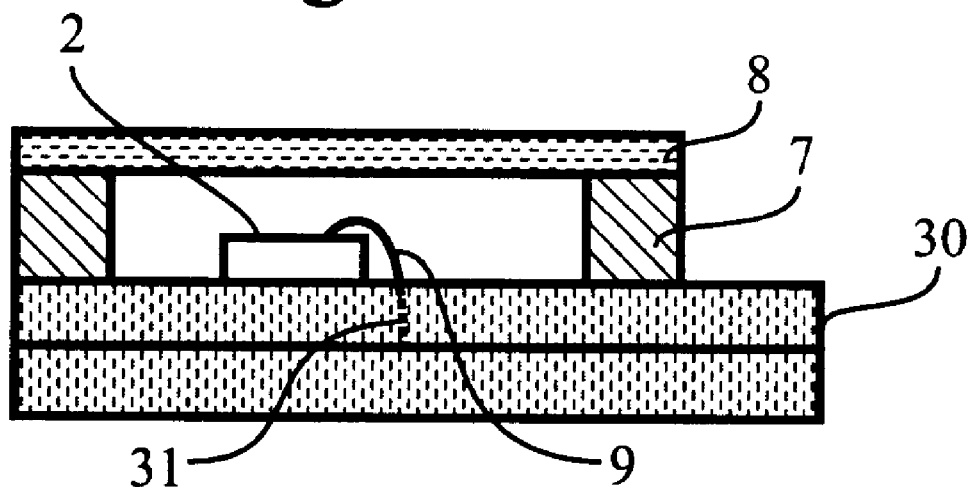

FIG. 14A is a cross-sectional view taken along the line G—G in FIG. 13, while FIG. 14B is a cross-sectional view taken along the line H—H in FIG. 13.

FIG. 15A is a cross-sectional plan view showing the structure of the high frequency interface portion of an integrated circuit package for high frequency signals in accordance with Conventional Example 1, while FIG. 15B is a cross-sectional view taken along the line I—I in FIG. 15A.

FIG. 16 is a cross-sectional view showing a package for MIC of Conventional Example 2.

Figure 17:
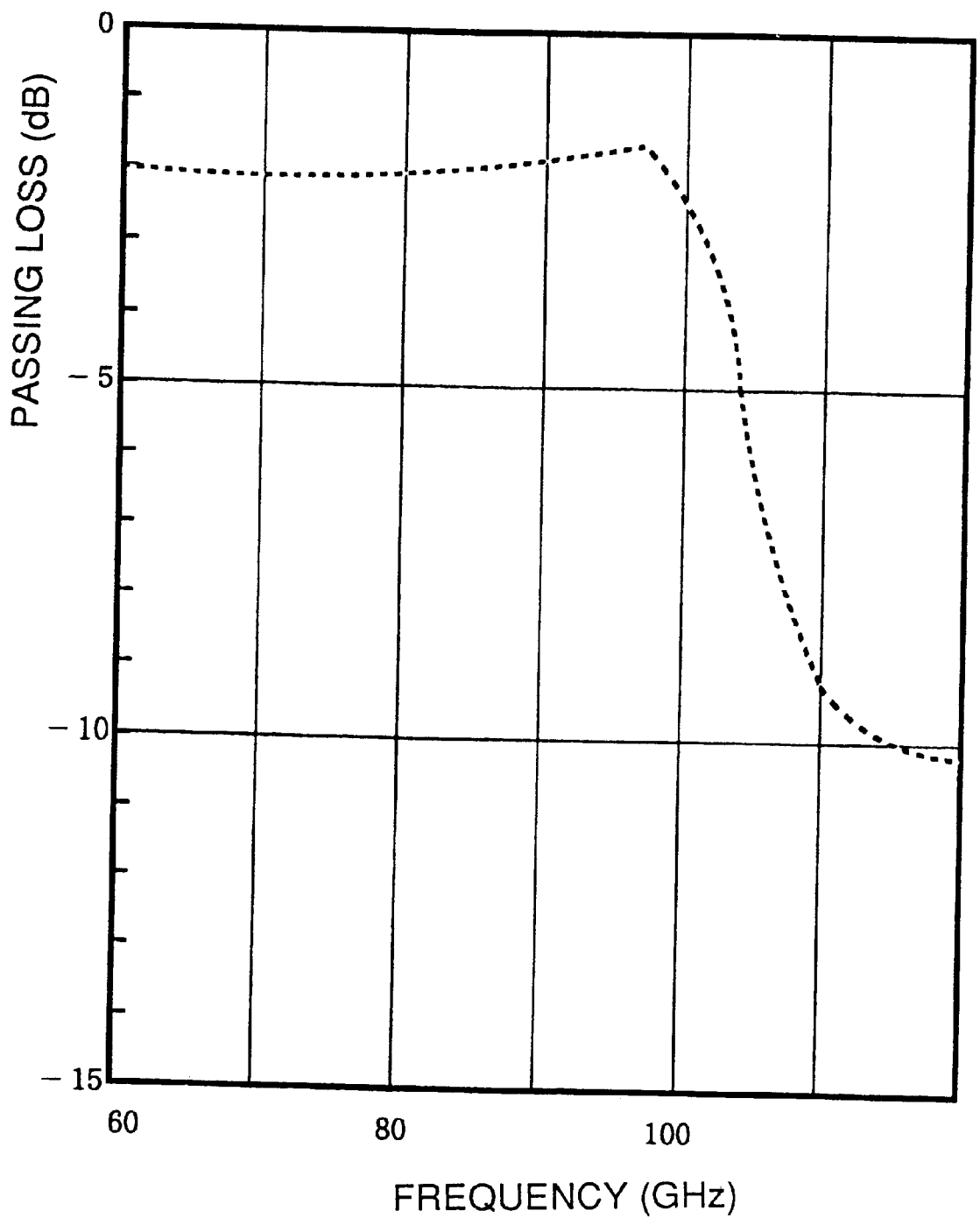

FIG. 17 is a graph showing a simulation of the passage loss when a conventional integrated circuit package for high frequency signals is employed.

DETAILED DESCRIPTION OF THE PREFERRED EMBODIMENTS

Figure 1:
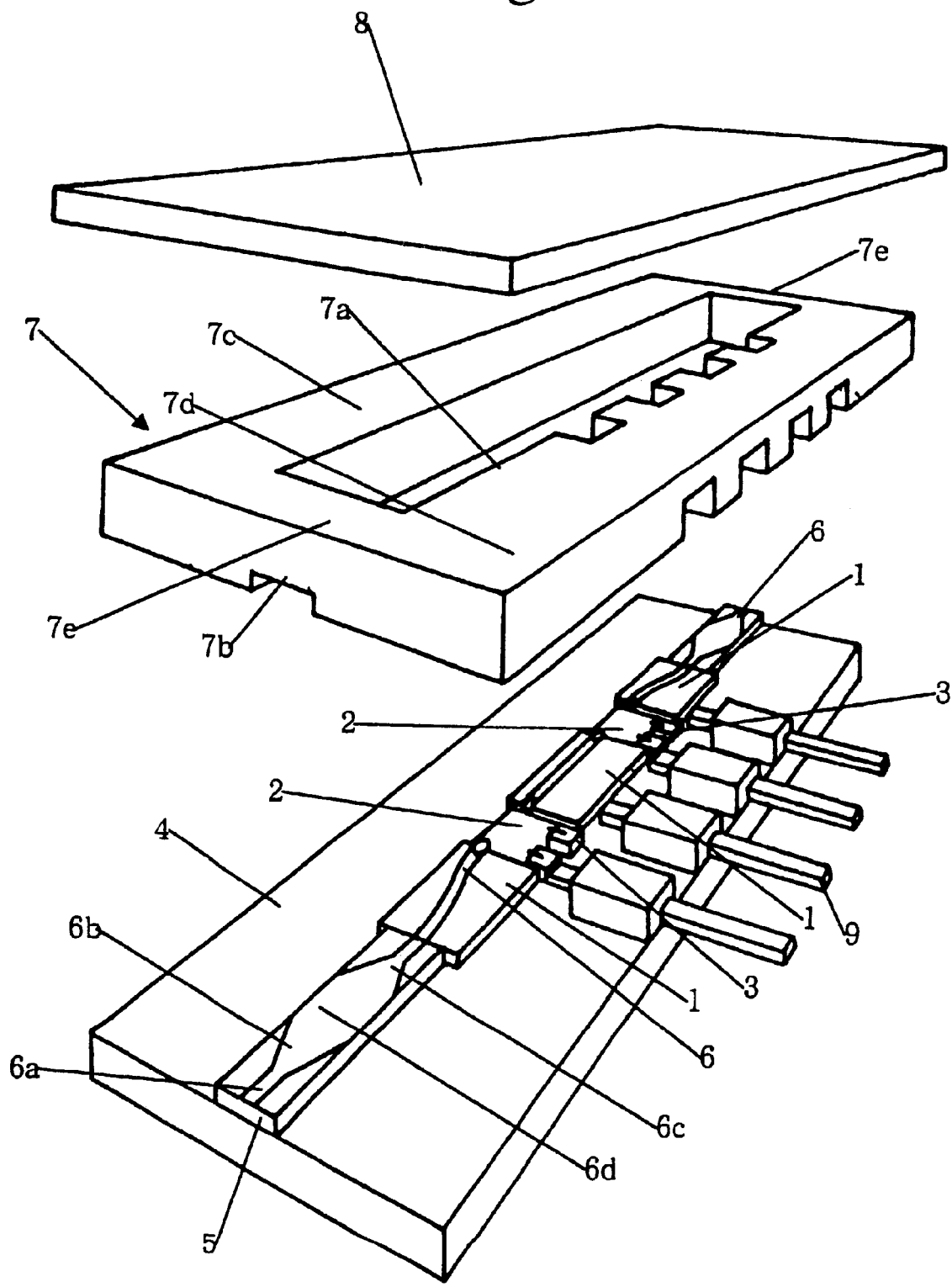
FIG. 1 is an exploded perspective view showing an integrated circuit package for high frequency signals in accordance with a first embodiment of the present invention.

Hereinbelow, the embodiments of the present invention will be explained with reference to the Figures. FIG. 1 is an exploded perspective view showing an integrated circuit package for high frequency signals in accordance with a first embodiment of the present invention, FIG. 2 is a plan view showing an integrated circuit package for high frequency signals in accordance with the first embodiment of the present invention (in the state in which the cover member is removed), and FIG. 3 is a perspective view showing a portion of the integrated circuit package for high frequency signals in accordance with the first embodiment of the present invention.

Figure 2:
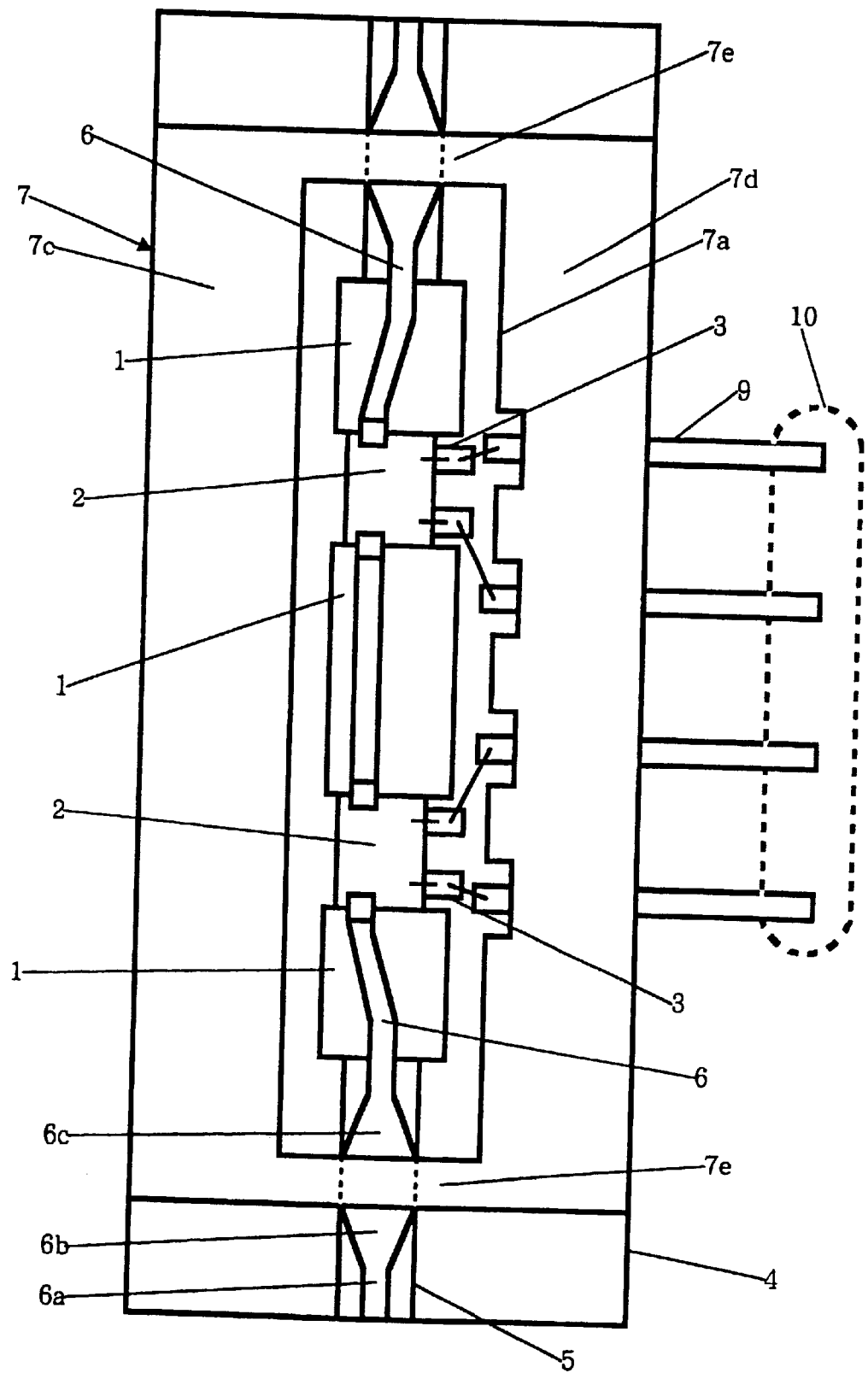
FIG. 2 is a plan view showing the integrated circuit package for high frequency signals in accordance with the first embodiment of the present invention (in the state in which the cover member is removed).
Figure 3:
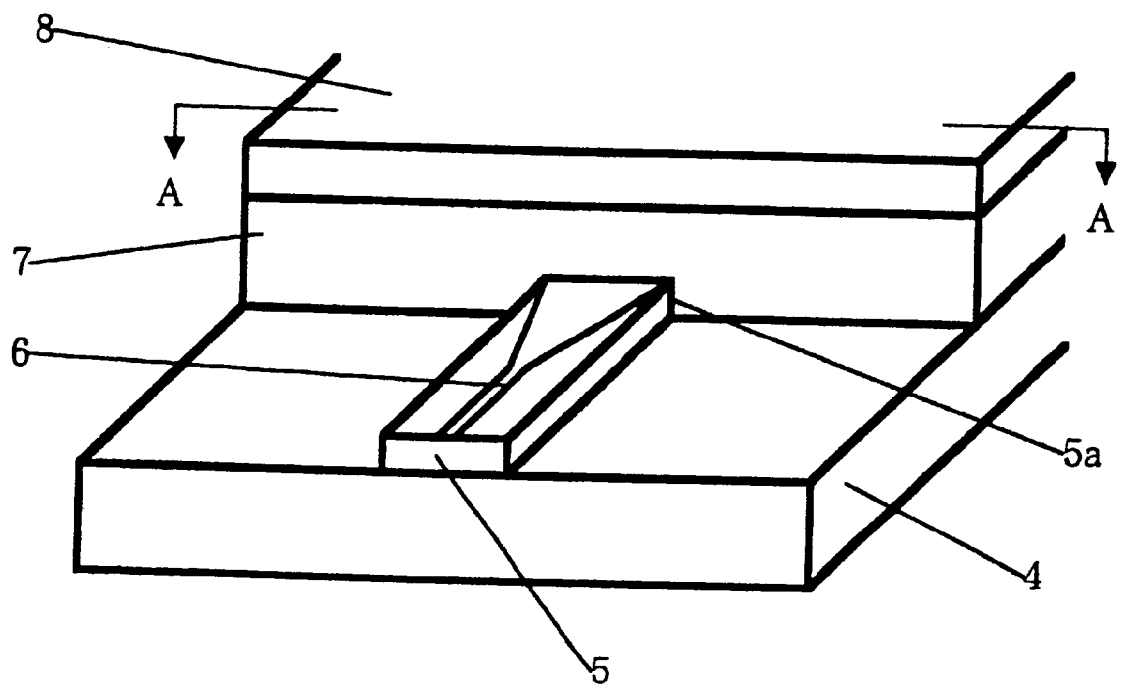
FIG. 3 is a perspective view showing a portion of the integrated circuit package for high frequency signals in accordance with the first embodiment of the present invention.

As shown in FIGS. 1–3, the integrated circuit package for high frequency signals of the first embodiment is provided with a base member 4, on which are installed integrated circuit components for high frequency signals such as a film circuit substrate 1, and MMIC (monolithic microwave integrated circuit) 2, a bypass capacitor 3, and the like, a dielectric substrate 5 which is provided on this base member 4, a microstrip line 6, which is provided on the dielectric substrate 5 and which is electrically connected with the integrated circuit for high frequency signals, a frame member 7, in which is formed a concave portion 7b which engages with the dielectric substrate 5, and in which is also formed an opening 7a which encloses the integrated circuit components, and a cover member 8, which seals the opening 7a of the frame member 7.

The MMIC 2 and the like installed on base member 4 are electrically connected with a bias terminal 10 (see FIG. 2) via a bias line 9 so that a bias may be supplied.

Base member 4 is formed in the shape of an elongated rectangular plate, and is made of, for example, metal. In general, semiconductor integrated circuits for the millimeter waveband employ a semiconductor material using gallium arsenide, so that in order to match the linear expansion coefficient of gallium arsenide, base member 4 preferably is made of, for example, Kovar, copper tungsten, or the like. Furthermore, in order to increase the heat radiation properties, base member 4 may be constructed using copper or the like.

Dielectric substrate 5 is formed in the shape of an elongated rectangular plate, and is preferably constructed from a material which is non-moisture absorbent and has little dielectric loss, such as, for example, alumina or the like.

Microstrip line 6 is the line which transmits high frequency signals of millimeter wavelengths or like. Microstrip line 6 is formed so as to extend to the outside of frame member 7, and the portions 6a which extend to the outside of frame member 7 form the input and output interface portions for the signals.

It is preferable that frame member 7 be constructed from a metal such as, for example, Kovar, copper tungsten, copper, or the like. Furthermore, frame member 7 is provided with a first frame portion 7c and second frame portion 7d, which are disposed in parallel with a predetermined space therebetween, and a pair of third frame portions 7e which are provided at the end portions of first frame portion 7c and second frame portion 7d. Furthermore, a rectangular opening 7a is formed within first frame portion 7c, second frame portion 7d, and third frame portion 7e.

The concave portion 7b formed in the bottom portion of third frame portions 7e comes into contact with the top of the widened portions 6d which are provided in microstrip line 6 and formed as to widen the conductor so as to have approximately the same width as that of the dielectric substrate 5, and thus engages with dielectric substrate 5: when this occurs, the waveguide portion 5a (see FIG. 3) of dielectric substrate 5, which is enclosed by concave portion 7b, functions as a waveguide using the dielectric material as a medium, and converts the transmission mode of the high frequency signals transmitted by the microstrip line 6 to the transmission mode of the waveguide. Widened portion 6d is formed with the width of the entire upper surface of the dielectric substrate 5, and the surrounding surfaces of dielectric substrate 5 are all cladded, so that this serves as the walls of the dielectric waveguide.

It is preferable that microstrip line 6 be provided with a first transmission mode converter 6b, which is formed in an inclined manner in the direction of widened portion 6d from the outside of frame member 7, and a second transmission mode converter 6c, which is formed in an inclined manner in the direction of the widened portion 6d from the inside of frame member 7. By means of providing such a first transmission mode converter 6b and second transmission mode converter 6c, it is possible to smoothly convert the transmission mode of the high frequency signals, and it is possible to conduct the satisfactory matching of the impedance. Furthermore, it is preferable that the length of transmission mode converters 6b and 6c be set so as to be one-half of the wavelength employed or more.

Cover 8 is formed so as to be in the shape of an elongated rectangular plate, and is preferably produced from a metal such as Kovar, copper tungsten, copper, or the like.

FIGS. 5A–5C are a cross-sectional views showing, in order, the processes of a manufacturing method for integrated circuit packages for high frequency signals in accordance with the present invention. FIG. 5C is a cross-sectional view taken along the line A—A in FIG. 3.

First, a base member 4 is prepared, in which are installed MMIC 2 and the like, dielectric substrate 5, and microstrip line 6, which is provided on the dielectric substrate 5, and which is electrically connected with MMIC 2 (see FIG. 5A).

Next, the concave portion 7b of frame member 7 is engaged with the widened portion 6d of microstrip line 6 and with the dielectric substrate 5, and these are attached using welding or soldering with silver solder or the like (see FIG. 5B). The portion of dielectric substrate 5 which is enclosed by concave portion 7b functions as waveguide portion 5a.

Finally, cover member 8 is attached to the upper portion of frame member 7 using welding or soldering with silver solder or the like, and the opening 7a of frame member 7 is sealed (see FIG. 5C). By means of this, the MMIC 2 and the like on base member 4 are sealed in an airtight manner.

Next, the operating principle of the microstrip line-waveguide conversion structure employed in the integrated circuit package for high frequency signals of the present invention will be explained.

FIGS. 4A–4C shows cross-sectional views showing the electrical force line distribution at various points; FIG. 4A shows microstrip line 6, FIG. 4B shows transmission mode converter 6b (6c), and FIG. 4C shows dielectric waveguide portion 5a.

The electric force lines L of the high frequency signals of the TEM mode transmitted by a microstrip line 6 with an electric force line distribution such as that shown in FIG. 4A are broadened as shown in FIG. 4B as a result of the widening of microstrip line 6 at transmission mode converter 6b (6c). Furthermore, the electric force lines L are concentrated in the dielectric material having a high dielectric constant, so that when microstrip line 6 widens and the ratio of the width of the dielectric substrate 5 and the width of microstrip line 6 approaches 1, as shown in FIG. 4C, the electrical force lines L are bent so as to be concentrated within dielectric substrate 5 at the edge of dielectric substrate 5, so that the shape approximates that of the electrical force line distribution of a waveguide TE 10 mode, and a conversion is achieved from the TEM mode to the TE 10 mode in waveguide portion 5a.

Next, the operation of the integrated circuit package for high frequency signals in accordance with the first embodiment will be explained.

Within the package, the high frequency signals are transmitted through microstrip line 6, which is positioned to the inside of frame member 7.

The high frequency signals are transmitted to waveguide portion 5a from microstrip line 6, which is positioned to the inside of frame member 7, via second transmission mode converter 6c. In waveguide 5a, a conversion is accomplished from the TEM mode, which is the transmission mode of microstrip line 6, to the TE 10 mode, which is the transmission mode of the waveguide.

By means of the first transmission mode converter 6b, the high frequency signals transmitted through waveguide portion 5a are converted from the TE 10 mode to the TEM mode, and are transmitted to the input and output interface portions 6a with the exterior.

Furthermore, on the other hand, the high frequency signals transmitted to microstrip line 6 from the exterior are converted in the waveguide portion 5a from the TEM mode to the TE 10 mode via the first transmission converter 6b.

The high frequency signals transmitted in waveguide portion 5a are converted from the TE 10 mode to the TEM mode by the second transmission mode converter 6c, and are transmitted to the microstrip line 6 which is positioned to the inside of frame member 7.

In accordance with the first embodiment, it is possible to realize an airtight seal of the integrated circuit for high frequency signals installed on the base member 4 by means of frame member 7 and cover member 8, so that the structure is simple, and manufacturing costs can be reduced.

Furthermore, the waveguide portion 5a formed by the enclosure of dielectric substrate 5 by the concave portion 7b of frame member 7 functions as a wave guide filled with the dielectric substance, so that the matching of the impedance is good, and it is possible to greatly reduce the transmission passing loss in comparison with that which was conventionally possible. As a result, an integrated circuit package for high frequency signals having high reliability can be provided.

Furthermore, the structure is not such as to conduct the conversion of the transmission mode by making the microstrip line in the form of an antenna, as was conventionally the case, so that it is possible to apply this to broadband frequencies. As a result, it is possible to broaden the uses.

FIG. 6 is a graph showing a simulation of the transmission loss in the case in which an integrated circuit package for high frequency signals in accordance with the present invention is employed. It can be seen from FIG. 6 that when the integrated circuit package for high frequency signals of the present invention is employed, the passage loss does not increase even as the frequency increases. Accordingly, the integrated circuit package for high frequency signals of the present invention increases the reliability of the package in semiconductor integrated circuits for the millimeter waveband of 60 GHz or more.

FIG. 7A is a perspective view showing a portion of a integrated circuit package for high frequency signals in accordance with a second embodiment of the present invention, while FIG. 7B is a cross-sectional view taken along the line B—B in FIG. 7A.

As shown in FIGS. 7A–7B, the second embodiment is fundamentally identical to the first embodiment; however, it is characterized in that a concave portion 4a is formed in a base member 4, and the dielectric substrate 5 engages in this concave portion 4a.

In accordance with the second embodiment, it is not necessary to form the concave portion 7b, which engages with dielectric substrate 5, in frame member 7, so that the design of frame member 7 is simplified, and the attachment of frame member 7 and base member 4 is also simplified.

FIG. 8 is an exploded perspective view showing an integrated circuit package for high frequency signals in accordance with the third embodiment of the present invention, while FIG. 9 is a plan view showing the integrated circuit package for high frequency signals in accordance with the third embodiment of the present invention (in a state in which the cover member is removed), and FIG. 10A is a cross-sectional view taken along the line C—C in FIG. 9, while FIG. 10B is a cross-sectional view taken along the line D—D in FIG. 9.

As shown in FIGS. 8 through 10B, the integrated circuit package for high frequency signals in accordance with the third embodiment is provided with a base member 14, on which are installed integrated circuit components such as a film circuit substrate 1, an MMIC 2, a bypass capacitor 3, and the like, a dielectric substrate 15 which is provided on this base member 14, a microstrip line 16, which is provided on the dielectric substrate 15, and which is electrically connected to the integrated circuit for high frequency signals, a frame member 17, in which an opening 17a which encloses the integrated circuit for high frequency signals is formed, and in end portions of which notched portions 17b are formed, and a cover member 18, which seals the opening 17a and the notched portions 17b of frame member 17.

Frame member 17 is provided with a first frame portion 17c and a second frame portion 17d, which are disposed with a predetermined spacing therebetween, and third frame portions 17e which are provided at positions to the inside of the end portions of first frame portion 17c and second frame portion 17d. As shown in FIGS. 10A and B, a concave portion 17f, which engages with the widened portion 16d which is formed so as to have the width of the entirety of the upper surface of the dielectric substrate 15, is formed in the lower portion of the third frame portions 17e. The waveguide portion 15a of dielectric substrate 15, which is enclosed by the concave portion 17f, serves as a waveguide using a dielectric material as the medium thereof, and this converts the transmission mode of the high frequency signals transmitted by the microstrip line 16 to the transmission mode of the dielectric waveguide.

Furthermore, as shown in FIG. 10A, the third frame portions 17e are provided with an inclined surface 17g which is inclined in the upward direction and toward the outside from the contact surface with concave portion 17f. This makes possible a smooth conversion of the transmission mode of the high frequency signals, and improves the matching of the impedance.

In accordance with the third embodiment, the spacing portion 19 formed by the notched portions 17b of frame member 17, the base member 14, and the cover member 18, serves as a waveguide using air as the medium thereof, and this functions as the input and output interface portion of the signals.

It is preferable that base member 14, frame member 17, and cover member 18 be constructed from a metal such as, for example, Kovar, copper tungsten, copper, or the like. It is preferable that dielectric substrate 15 be made from a material which is non-moisture absorbent and has little dielectric loss, such as, for example, alumina, or the like.

Furthermore, microstrip line 16 is provided with a transmission mode converter 16a which is formed so as to be inclined in the direction of widened portion 16d on the side of frame member 17 from within frame member 17, so that it is possible to smoothly convert the transmission mode of the high frequency signals.

Next, the operation of the integrated circuit package for high frequency signals in accordance with the third embodiment will be explained.

Within the package, the high frequency signals are transmitted through a microstrip line 16 which is positioned so as to be inside of frame member 17. The high frequency signals are converted from the TEM mode, which is the transmission mode of the microstrip line 16, to the TE 10 mode, which is the transmission mode of the waveguide, from microstrip line 16, which is positioned to the inside of frame member 17, and via transmission mode converter 16a.

Next, the high frequency signals transmitted to the waveguide portion 15a are transmitted to the spacing portion 19 which serves as the input and output interface portion for the signals.

Furthermore, on the other hand, the high frequency signals transmitted to the spacing portion 19 from the exterior are first converted from the TEM mode to the TE 10 mode by waveguide portion 15a and then are converted from the TE 10 mode to the TEM mode by transmission mode converter 16a, and are transmitted to the microstrip line 16 which is positioned to the inside of frame member 17.

In accordance with the third embodiment, it is possible to realize an airtight seal in the integrated circuit for high frequency signals installed in the base member, by means of frame member 17 and cover member 18.

Furthermore, the spacing portion 19 which is formed by the notched portions 17b of frame member 17, the base member 14, and the cover member 18 serves as a waveguide having air as the medium thereof, and serves as the input and output interface portion of the signals, so that the matching of the interface becomes satisfactory, and it is possible to greatly reduce the transmission passage loss in comparison with that conventionally obtainable.

FIG. 11 is a plan view showing an integrated circuit package for high frequency signals in accordance with a fourth embodiment of the present invention, while FIG. 12A is a cross-sectional view taken along the line E—E in FIG. 11, and FIG. 12B is a cross-sectional view taken along the line F—F in FIG. 11.

As shown in FIGS. 11, 12A and 12B, the integrated circuit package for high frequency signals in accordance with the fourth embodiment is provided with: a base member 24, on which are installed integrated circuit components such as film circuit substrate 1, MMIC 2, bypass capacitor 3, and the like, a dielectric substrate 25 which is provided on this base member 24, a microstrip line 26 which is provided on the dielectric substrate 25 and which is electrically connected with the integrated circuit for high frequency signals, a frame member 27, in which are formed a first opening 27a which encloses the integrated circuit for high frequency signals and a second opening 27b which is positioned to the outside of the first opening 27a and with a predetermined spacing therebetween, and a cover member 28 (see FIGS. 12A and 12B) which seals the first and second openings 27a and 27b of frame member 27.

Frame member 27 is provided with a first frame portion 27c and a second frame portion 27d, which are disposed with a predetermined space therebetween, and with third frame portions 27e, which are provided between the first and second openings 27a and 27b. As is shown in FIGS. 12A and B, a concave portion 27f, which engages with the widened portions 26d formed with the width of the entirety of the upper surface of dielectric substrate 15, is formed in the lower portion of the third frame portions 27e. The waveguide portion 25a of dielectric substrate 25 which is enclosed by concave portion 27f serves as a waveguide having a dielectric material as the medium thereof, and this converts the transmission mode of the high frequency signals transmitted by the microstrip line 26 to the transmission mode of the dielectric waveguide.

As is shown in FIG. 12A, a third opening 24a which communicates with the end portion of dielectric substrate 25 on the side of second opening 27b, and which serves as the input and output interface portion for the signals, is formed in base member 24. This third opening 24a is formed so as to extend in an approximately vertically downward direction, and it is preferable that it increase in breadth in the downward direction. This is so that the transmission mode of the high frequency signals may be smoothly converted, and so that the matching of the impedance is satisfactory.

It is preferable that base member 24, frame member 27, and cover member 28 be constructed from a metal such as, for example, Kovar, copper tungsten, copper, or the like. It is preferable that dielectric substrate 25 be made from a material which is non-moisture absorbent and has little dielectric loss, such as, for example, alumina, or the like.

Furthermore, microstrip line 26 is provided with a transmission mode converter 26a which is formed so as to be inclined in the direction of widened portion 26d on the side of frame member 27 from within frame member 27, so that it is possible to smoothly convert the transmission mode of the high frequency signals.

In accordance with the fourth embodiment, by means of the third opening 24a formed in base member 24, interface in the vertical direction becomes possible.

FIG. 13 is a plan view showing an integrated circuit package for high frequency signals in accordance with a fifth embodiment of the present invention (the state is depicted in which the cover member is removed), while FIG. 14A is a cross-sectional view taken along the line G—G in FIG. 13, and FIG. 14B is a cross-sectional view taken along the line H—H in FIG. 13.

In the first through fourth embodiments, a metal substrate was employed as the base member; however, a ceramic multilayered substrate is used as the base member 30 in the fifth embodiment.

In accordance with the fifth embodiment, as shown in FIG. 14B, the bias line 9 of MMIC 2 and the like is connected to the inter-layer space of base member 30 via hole 31. Accordingly, in comparison with first through fourth embodiments, the wiring of bias line 9 and the like is simplified, and the structure is appropriate for the creation of multi-chip modules. In FIGS. 14A and 14B, the base member 30 has two layers; however, three or more layers are also possible.

The present invention is in no way restricted to the embodiments described; a variety of modifications are possible within the technological range described in the patent claims. For example, the base member and the frame member may be made unitary. Furthermore, a metal cover formed so as to be unitary with the frame member and the cover member may be employed.

The present invention may be used in, for example, wireless LANs or millimeter wave radar, or the like.

The integrated circuit package for high frequency signals in accordance with the present invention may be designed with a variety of sizes depending on the purpose of use, the conditions of use, the physical limitations, and the like; however, when used for high frequencies from 70 GHz to 90 GHz in, for example, the first embodiment, the following sizes are employed.

The base member 4 has a length of 18.5 mm, a breadth of 6 mm, and height of 2 mm. The dielectric substrate has a length of 4 mm, a breadth of 1 mm, and a height of 0.254 mm. The concave portion 7b of frame member 7 has a width of 1 mm and a height of 0.254 mm. The opening of 7a of frame member 7 has a length of 13.7 mm and a width of 2 mm. The width of third frame portion 7e of frame member 7 is 1 mm. The cover member 18 has a length of 15.7 mm, a width of 6 mm, and a height of 1 mm.

In accordance with the microstrip line-waveguide conversion structure of the present invention, by providing a waveguide portion containing a widened portion on a dielectric substrate, it is possible to convert the transmission mode of a high frequency signal to the transmission mode of the dielectric waveguide, so that in comparison with the conventional technology, the structure is greatly simplified, and this enables a reduction in manufacturing costs.

Furthermore, the structure is not like the conventional structure in which conversion of the transmission mode was conducted with a microstrip line which projected in the form of an antenna within the waveguide, but rather, conversion may be accomplished in a straight-line manner, so that the matching of the impedance is satisfactory, and it is possible to greatly reduce the transmission passage loss. As a result, a highly reliable conversion structure is provided.

Furthermore, it is possible to employ broadband frequencies, and application to a variety of uses thus becomes possible.

In accordance with the integrated circuit package for high frequency signals of the present invention, by means of the waveguide portion formed by a metal cover attached from above to a base member, it is possible to simultaneously realize the conversion of a high frequency signal to the transmission mode of the dielectric waveguide and the airtight sealing of the integrated circuit for high frequency signals.

In accordance with the manufacturing method for integrated circuit packages for high frequency signals of the present invention, it is possible to obtain the integrated circuit package for high frequency signals provided with the microstrip line-waveguide conversion structure described above by means of an extremely simple process. As a result, the throughput increases.

What is claimed is:

1. A microstrip line-waveguide conversion structure, comprising:
   a dielectric substrate,
   a microstrip line provided on the dielectric substrate for receiving signals of at least one predetermined wavelength,
   a transmission mode converter connected to said microstrip line,
   a widened microstrip line connected to said transmission mode converter, wherein a width of said widened microstrip line is substantially equal to a width of said dielectric substrate; and
   a conductive frame member attached over said widened microstrip line at a position which leaves the transmission mode converter outside of said frame member.

2. A microstrip line-waveguide conversion structure according to claim 1, wherein said transmission mode converter includes an inclined portion of said microstrip line which increases in width in a direction towards said widened microstrip line.

3. A microstrip-line-waveguide conversion structure according to claim 1, wherein said microstrip line transmits a high frequency signal in the millimeter waveband.

4. A microstrip line-waveguide conversion structure according to claim 1, wherein said microstrip line for receiving signals of at least one predetermined wavelength is located at a terminal end of said dielectric substrate.

5. An integrated circuit package for high frequency signals, comprising:
- a base member on which an integrated circuit for high frequency signals is installed,
- a dielectric substrate which is provided on said base member,
- a microstrip line provided on said dielectric substrate, said microstrip line having widened portions approximately equivalent to a width of said dielectric substrate,
- a conductive frame member having a concave portion which engages said widened portions of said microstrip line and said dielectric substrate, said frame member having an opening which encloses a periphery of said integrated circuit for high frequency signals, and
- a conductive cover member, which seals said opening of said frame member, and seals in an airtight manner said integrated circuit for high frequency signals; wherein
- a waveguide portion, which is formed on said dielectric substrate at a point of contact between said widened portions provided in said microstrip line and said concave portion of said frame member, is provided, and an airtight seal is achieved.

6. An integrated circuit package for high frequency signals according to claim 5, wherein said base member and said frame member are formed integrally.

7. An integrated circuit package for high frequency signals according to claim 5, wherein a transmission mode converter is provided in said microstrip line.

8. An integrated circuit package for high frequency signals according to claim 7, wherein said transmission mode converter has a width which increases in a direction towards said widened portions of said microstrip line.

9. A integrated circuit package for high frequency signals according to claim 5, wherein said microstrip line is formed so as to extend to the outside of said frame member, and portions of said microstrip line extending outside said frame member serve as input and output interface portions for high frequency signals.

10. An integrated circuit package for high frequency signals according to claim 5, wherein said frame member is provided with a first frame portion and a second frame portion which are disposed with a predetermined space therebetween, and a pair of third frame portions provided at both end portions of said first frame portion and said second frame portion, and said opening is formed within said first frame portion, said second frame portion, and said third frame portions.

11. An integrated circuit package for high frequency signals according to claim 5, wherein said frame member and said cover member are formed from metal.

12. An integrated circuit package for high frequency signals according to claim 11, wherein said frame member and said cover member are formed from a substance selected from a group consisting of copper tungsten, copper, and a low-expansion metal allow of nickel-cobalt-iron having a concentration of nickel of between 28.8 to 29.8%, a concentration of cobalt of between 15.8 and 16.8%, and a balance concentration of iron by weight percent.

13. An integrated circuit package for high frequency signals, which is provided with:
- a base member on which an integrated circuit for high frequency signals is installed,
- a dielectric substrate which is provided on said base member,
- a microstrip line which is provided on said dielectric substrate, is electrically connected with said integrated circuit for high frequency signals, and which is provided with widened portions so as to be approximately equivalent to a width of said dielectric substrate,
- a conductive frame member, in which a first opening, which encloses a periphery of said integrated circuit for high frequency signals, and a second opening which is formed outside said first opening and with a predetermined space therebetween, are formed, and in which a concave portion, which engages with said widened portions of said microstrip line and said dielectric substrate, is formed between said first and second openings, and
- a conductive cover member, which seals said first and second openings of said frame member, and which seals in an airtight manner said integrated circuit for high-frequency signals; wherein
- a third opening, which communicates with said dielectric substrate at a side of said second opening, is formed in said base member,
- a waveguide portion, formed on said dielectric substrate at a point of contact between said widened portions provided in said microstrip line and said concave portion of said frame member, is provided, and an airtight seal is achieved, and
- said third opening serves as the input and output interface portion for high frequency signals converted to the transmission mode of the waveguide employing air as a medium thereof.

14. An integrated circuit package for high frequency signals according to claim 13, wherein said third opening of said base member is formed so as to extend approximately vertically downward.

15. An integrated circuit package for high frequency signals according to claim 14, wherein said third opening of said base member is formed so as to widen in the downward direction.

16. An integrated circuit package for high frequency signals, wherein an integrated circuit for high frequency signals which is provided on a base member, and
- a microstrip line having widened portions are covered in an attached manner by a metal cover, and wherein a waveguide portion formed on a dielectric substrate is provided and an airtight seal is formed at a point of contact between said metal cover and said widened portions in said microstrip line.

17. An integrated circuit package for high frequency signals according to claim 16, wherein said dielectric substrate is formed from a material having the characteristics of being non-moisture absorbent and having low dielectric loss.

18. An integrated circuit package for high frequency signals according to claim 17, wherein said dielectric substrate is formed from alumina.

19. A microstrip line-waveguide conversion structure according to claim 16, wherein a shape of said waveguide portion is determined by a width and a thickness of said dielectric substrate.

20. An integrated circuit package for high frequency signals according to claim 16, wherein said base member is formed of metal.

21. An integrated circuit package for high frequency signals according to claim 20, wherein said base member is formed from a material selected from a group consisting of copper tungsten, copper, and a low-expansion metal allow of nickel-cobalt-iron having a concentration of nickel of between 28.8 to 29.8%, a concentration of cobalt of between 15.8 and 16.8%, and a balance concentration of iron by weight percent.

22. An integrated circuit package for high frequency signals according to claim 16, wherein said base member is formed from a multilayer substrate.

23. An integrated circuit package for high frequency signals according to claim 22, wherein said base member is formed from a multilayered substrate made of ceramic.

24. An integrated circuit package for high frequency signals according to claim 22, wherein electrical wires connected electrically with said integrated circuit for high frequency signals are disposed between layers of said multilayered substrate.

25. A microstrip line-waveguide conversion structure according to claim 16, wherein a plurality of transmission mode converters are formed in a vicinity of said widened portions of said microstrip line.

26. A microstrip line-waveguide conversion structure according to claim 25, wherein said plurality of transmission mode converters include a first transmission mode converter and a second transmission mode converter disposed on different sides of said widened portions of said microstrip line, said first transmission mode converter and said second transmission mode converter each having a width which increases in a direction towards said widened portions of said microstrip line.

27. An integrate a circuit package for high frequency signals according to claim 16, wherein the high frequency signals transmitted are millimeter waveband signals.

28. A manufacturing method for integrated circuit packages for high frequency signals, wherein
an integrated circuit for high frequency signals, and a microstrip line provided with widened portions, are provided on a base member, and
attaching a metal cover over said integrated circuit for high frequency signals and said widened portions of said microstrip line to form an airtight seal, and wherein a waveguide portion,is formed on a dielectric substrate at a point of contact between said widened portions provided in said microstrip line and said metal cover.

29. A manufacturing method for integrated circuit packages for high frequency signals according to claim 28, wherein high frequency signals transmitted are signals in the millimeter waveband.

30. A manufacturing method for integrated circuit packages for high frequency signals, wherein are provided:
(1) a process for preparing a base member having an integrated circuit for high frequency signals, a dielectric substrate on said base member, and a microstrip line on said dielectric substrate, which is provided on said dielectric substrate, is electrically connected with said integrated circuit for high frequency signals, and wherein is provided widened portions so that a width thereof is approximately equal to that of said dielectric substrate,
(2) a process for disposing a conductive frame member provided with frame portions in which openings are formed and in which a concave portion is formed so that said concave portion of said frame portions engages with said widened portions of said microstrip line and said dielectric substrate, and said openings enclose the periphery of said integrated circuit for high frequency signals, and for attaching said frame member to said base member, and
(3) a process for attaching a conductive cover member to the upper portion of said frame member, closing said opening in said frame member, and sealing said integrated circuit for high frequency signals in an airtight manner; wherein a waveguide portion, formed on said dielectric substrate at a point of contact between said widened portions provided in said microstrip line and said concave portion of said frame member, is provided, and an airtight seal is achieved.

31. A manufacturing method for integrated circuit packages for high frequency signals according to claim 30, wherein said frame member is attached to said base member by welding.

32. A manufacturing method for integrated circuit packages for high frequency signals according to claim 30, wherein said cover member is attached to said frame member by soldering.

33. A manufacturing method for integrated circuit packages for high frequency signals, according to claim 30, wherein said cover member is attached to said frame member by welding.

34. A manufacturing method for integrated circuit packages for high frequency signals according to claim 30, wherein said frame member is attached to said base member by soldering.

35. A microstrip line-waveguide structure comprising:
a dielectric substrate,
a microstrip line provided on the dielectric substrate for receiving signals of at least one predetermined wavelength,
a transmission mode converter connected to said microstrip line,
a widened microstrip line connected to said transmission mode converter, wherein a width of said widened microstrip line is substantially equal to a width of said dielectric substrate; and
a frame member having a concave portion, and
wherein a point of contact exists between the concave portion of said frame member and said widened portion of said microstrip line.

36. A microstrip line-waveguide structure according to claim 35, further comprising:
a metal cover attached to an upper surface of said frame member to form an airtight seal inside an interior of said frame member.

37. A microstrip line-waveguide structure according to claim 35, wherein the concave portion of said frame member contacts said widened microstrip line so that part of said widened microstrip line lies outside said frame member and another part of said widened portion lies inside said frame member.

38. A microstrip line-waveguide structure according to claim 37, wherein said transmission mode converter is connected to a side of said widened portion which lies inside of said frame member.

39. A microstrip line-waveguide structure according to claim 38, further comprising:
a second transmission mode converter formed on another side of said widened microstrip line which lies outside of said frame member.

40. A microstrip line-waveguide structure according to claim 39, wherein said first transmission mode converter includes a first portion of said microstrip line with inclined sides, and wherein a width of said first portion of said microstrip line with inclined sides increases in width in a direction towards said widened portion of said microstrip line.

41. A microstrip line-waveguide structure according to claim 40, wherein said second transmission mode converter includes a second portion of said microstrip line with inclined sides, and wherein a width of said second portion of said microstrip line with inclined sides increases in width in a direction towards said widened portion of said microstrip line.

42. A microstrip line-waveguide structure according to claim 41, wherein the inclined sides of said first portion of said microstrip line and the inclined sides of said second portion of said microstrip line oppose one another.

43. A microstrip line-waveguide structure according to claim 40, wherein said first portion of said microstrip line with inclined sides has a length equal to one-half of an operating wavelength of an integrated circuit enclosed within said frame member.

44. An integrated circuit package for high frequency signals, which is provided with:
   a base member on which an integrated circuit for high frequency signals is installed,
   a dielectric substrate which is provided on said base member,
   a microstrip line which is provided on said dielectric substrate, is electrically connected with said integrated circuit for high frequency signals, and which is provided with widened portions so as to be approximately equivalent to a width of said dielectric substrate,
   a conductive frame member which is positioned on said widened portions of said microstrip line, and in which an opening which encloses a periphery of said integrated circuit for high frequency signals is formed, and
   a conductive cover member, which seals said opening of said frame member, and seals in an airtight manner said integrated circuit for high frequency signals; wherein
   a waveguide portion, which is formed on said dielectric substrate at a point of contact between said widened portions provided in said microstrip line and said frame member, is provided, and an airtight seal is achieved.

45. An integrated circuit package for high frequency signals, which is provided with:
   a base member on which an integrated circuit for high frequency signals is installed,
   a dielectric substrate which is provided on said base member,
   a microstrip line which is provided on said dielectric substrate, is electrically connected with said integrated circuit for high frequency signals, and which is provided with widened portions so as to be approximately equivalent to a width of said dielectric substrate,
   a conductive frame member in which a concave portion, which engages with said widened portions of said microstrip line and said dielectric substrate, is formed, in which an opening which encloses a periphery of said integrated circuit for high frequency signals is formed, and in end portions of which notched portions are formed, and
   a conductive cover member, which seals said opening and said notched portions of said frame member, and seals in an airtight manner said integrated circuit for high frequency signals; wherein
   a waveguide portion, which is formed on said dielectric substrate at a point of contact between said widened portions provided in said microstrip line and said concave portion of said frame member, is provided, and an airtight seal is achieved, and
   a spacing portion formed by said notched portions of said frame member, said base member, and said cover member serves as the input and output interface portion for high frequency signals converted to the transmission mode of a waveguide employing air as a medium.

46. An integrated circuit package for high frequency signals according to claim 45, wherein said frame member is provided with a first frame portion and a second frame portion which are disposed with a predetermined space therebetween, and third frame portions which are provided at a position within end portions of said first frame portion and second frame portion and which come into contact with said widened portions of said microstrip line, and a concave portion, which engages with said widened portions of said microstrip line and said dielectric substrate, is formed in said third frame portions, and said third frame portions are provided with an inclined surface which is outwardly inclined to a side of said cover member, from a contact surface at which contact is made with the upper portion of said widened portions of said microstrip line.

* * * * *